United States Patent [19]
Uehara et al.

[11] Patent Number: 5,946,563
[45] Date of Patent: Aug. 31, 1999

[54] SEMICONDUCTOR DEVICE AND METHOD OF MANUFACTURING THE SAME

[75] Inventors: Takashi Uehara; Toshiki Yabu, both of Osaka; Mizuki Segawa, Kyoto; Takashi Nakabayashi, Osaka; Minoru Fujii, Hyogo, all of Japan

[73] Assignee: Matsushita Electric Industrial Co., Ltd., Osaka, Japan

[21] Appl. No.: 08/880,880

[22] Filed: Jun. 23, 1997

Related U.S. Application Data

[62] Division of application No. 08/574,368, Dec. 18, 1995, Pat. No. 5,698,902.

[51] Int. Cl.⁶ .................................................. H01L 21/338
[52] U.S. Cl. .......................... 438/183; 438/622; 438/926
[58] Field of Search ..................................... 438/183, 180, 438/167, 926, 622

[56] References Cited

U.S. PATENT DOCUMENTS

| | | | |
|---|---|---|---|
| 4,902,646 | 2/1990 | Nakano | 438/577 |
| 5,225,704 | 7/1993 | Wakamiya et al. | 257/409 |
| 5,278,105 | 1/1994 | Eden et al. | 438/129 |
| 5,281,555 | 1/1994 | Cho | 438/625 |
| 5,410,161 | 4/1995 | Narita | 257/41 |
| 5,441,915 | 8/1995 | Lee | 438/631 |
| 5,441,916 | 8/1995 | Motonami | 438/620 |

FOREIGN PATENT DOCUMENTS 63-283155  11/1989  Japan .

*Primary Examiner*—John F. Niebling
*Assistant Examiner*—Christopher Lattin
*Attorney, Agent, or Firm*—McDermott, Will & Emery

[57] ABSTRACT

There are provided: an isolation protruding upward from a semiconductor substrate in an active region; a gate electrode formed in the active region; and a pair of dummy electrodes formed to extend over the active region and the isolation and substantially in parallel with the gate electrode. Each of the gate electrode and dummy electrodes is composed of a lower film and an upper film. The lower films of the dummy electrodes are formed flush with the isolation and in contact with the side edges of the isolation. With the dummy electrodes, any gate electrode can be formed in a line-and-space pattern, so that the finished sizes of the gate electrode become uniform. This enables a reduction in gate length and therefore provides a semiconductor device of higher integration which is operable at a higher speed and substantially free from variations in finished size resulting from the use of different gate patterns.

13 Claims, 16 Drawing Sheets

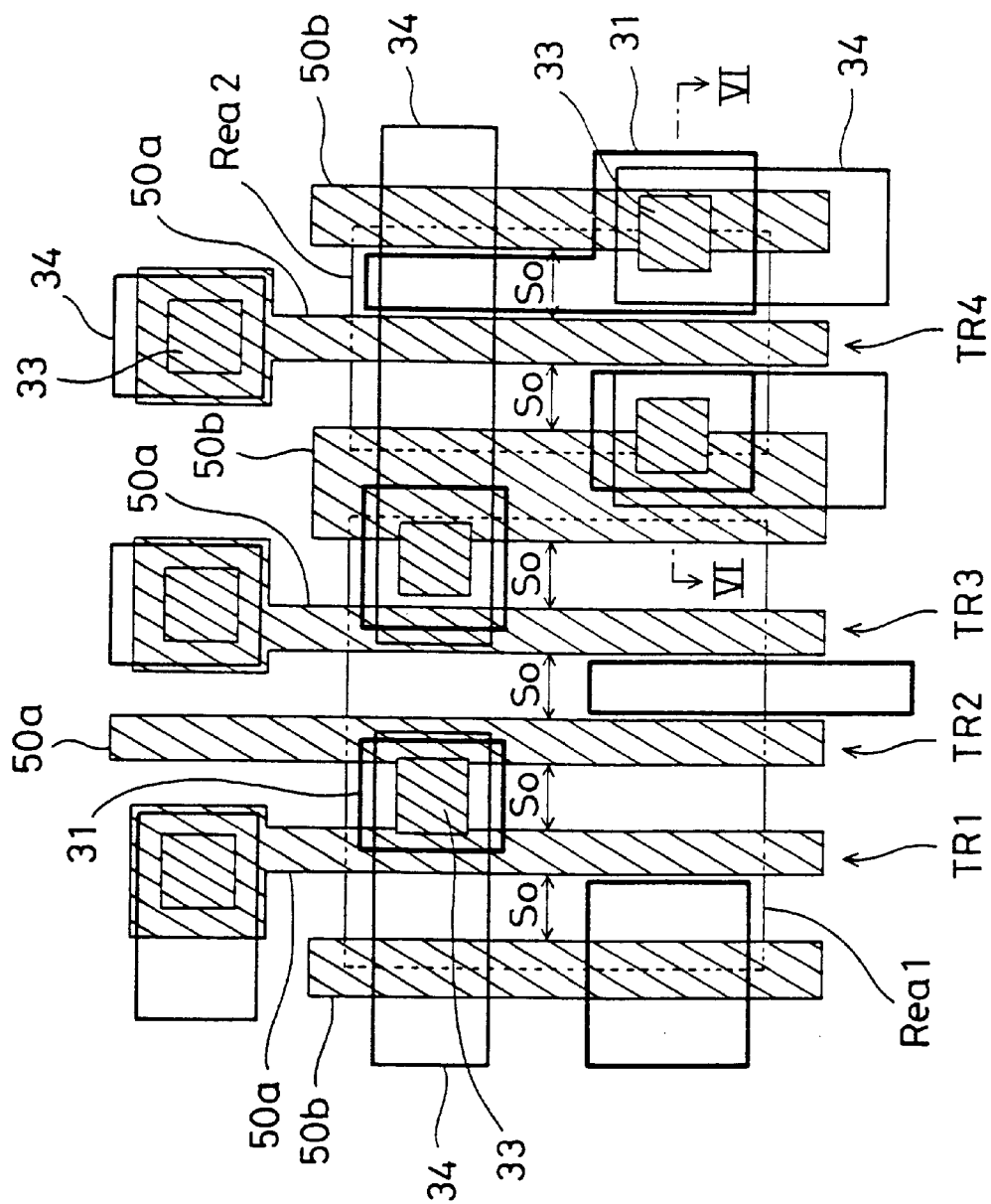

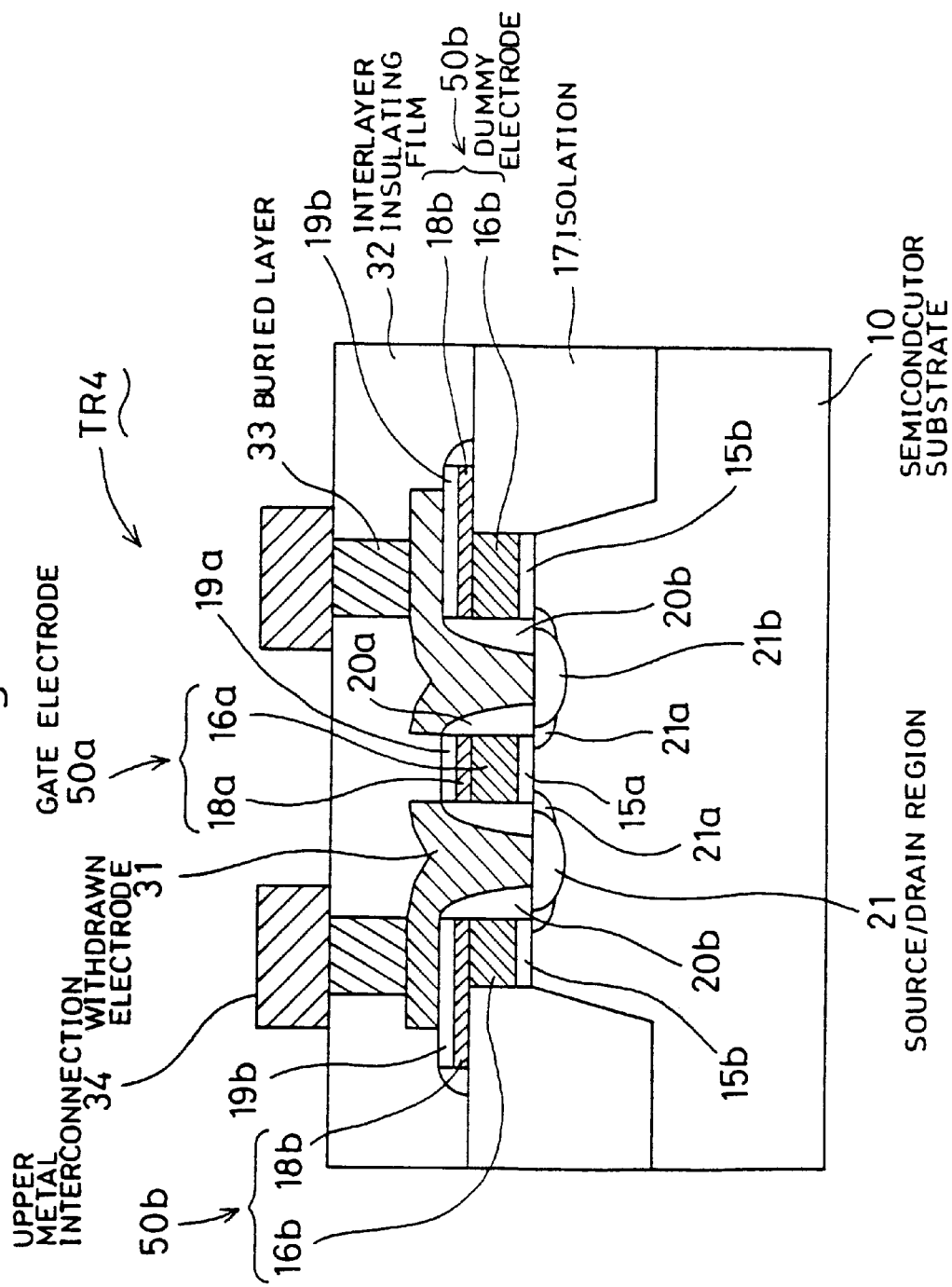

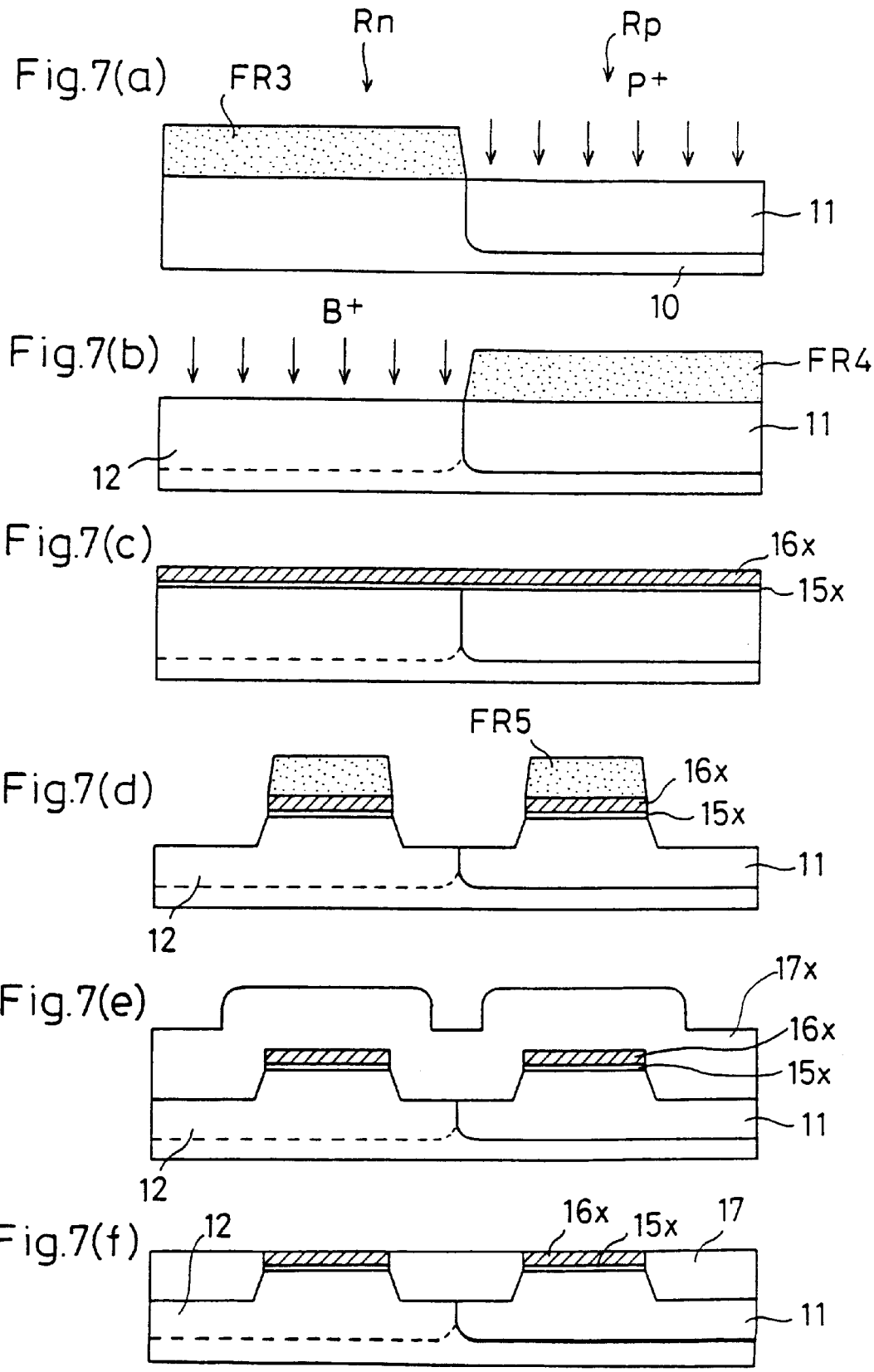

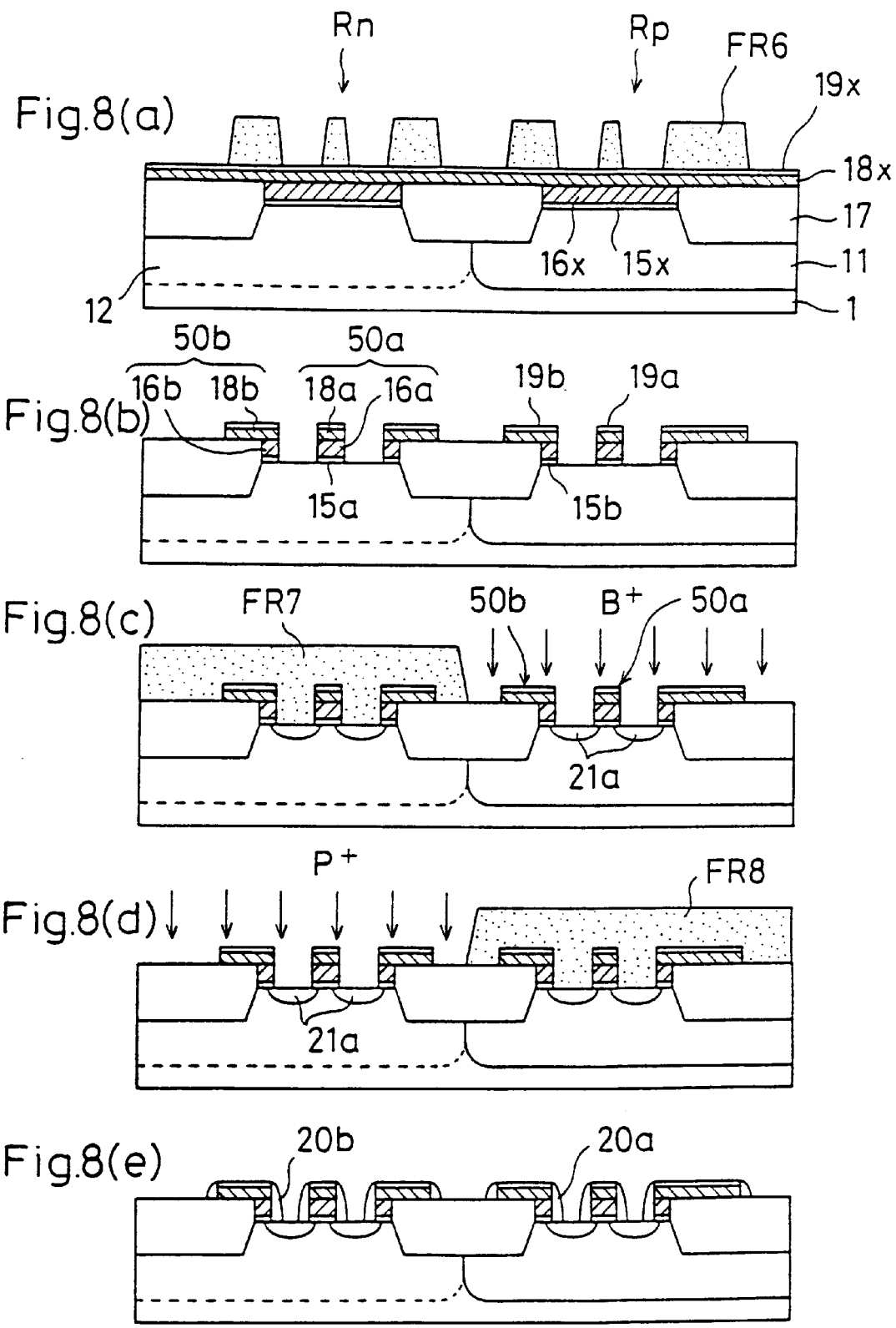

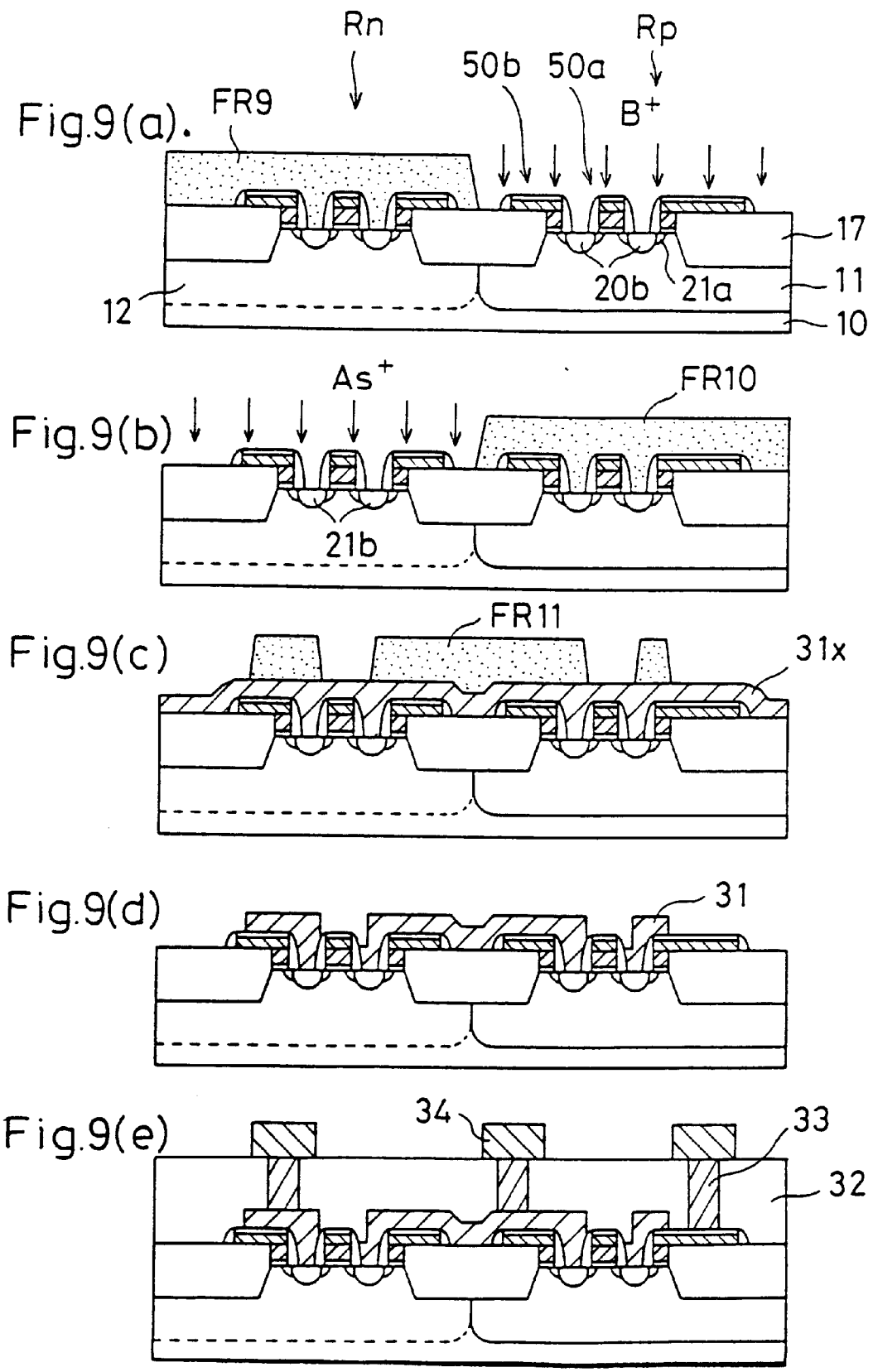

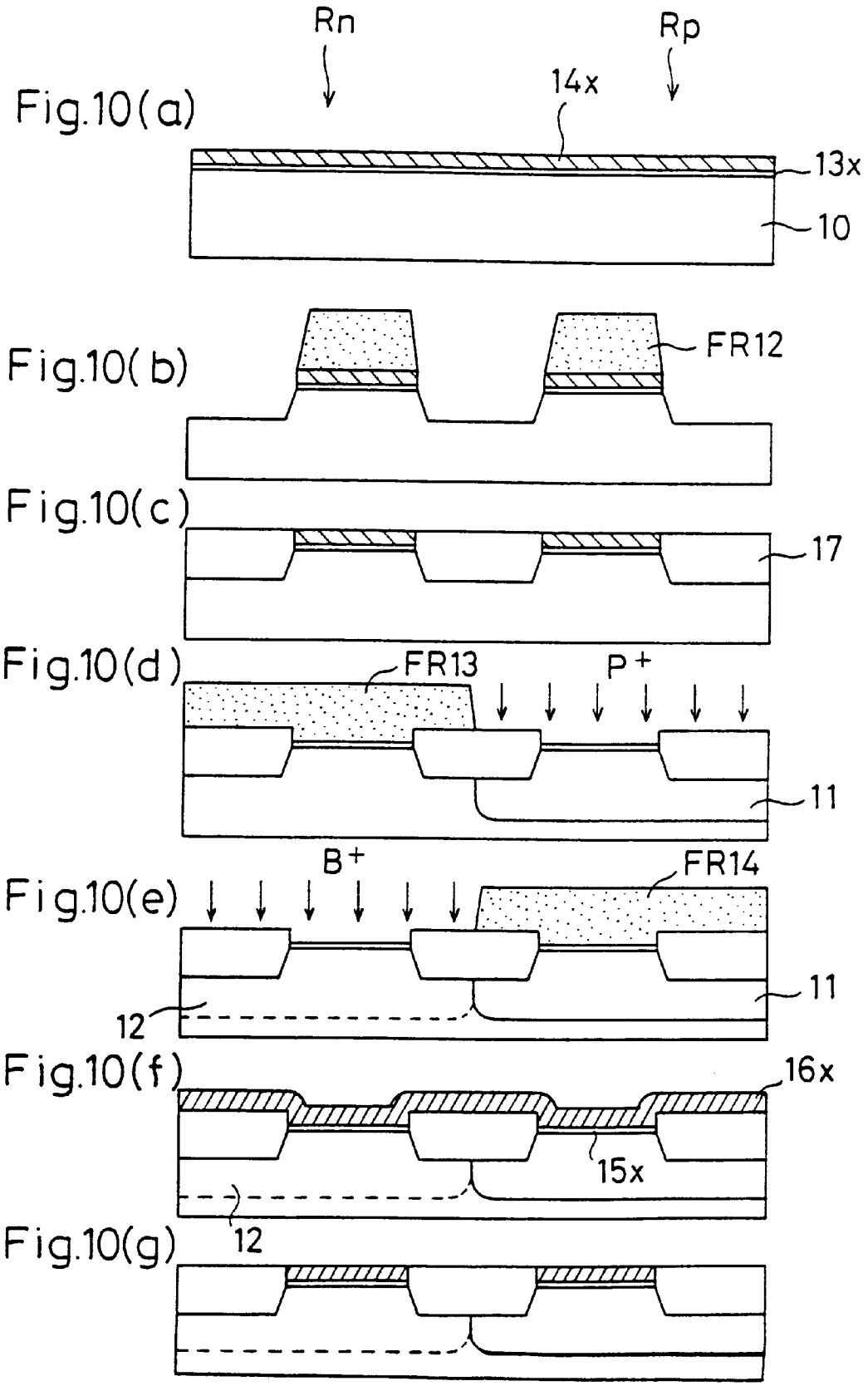

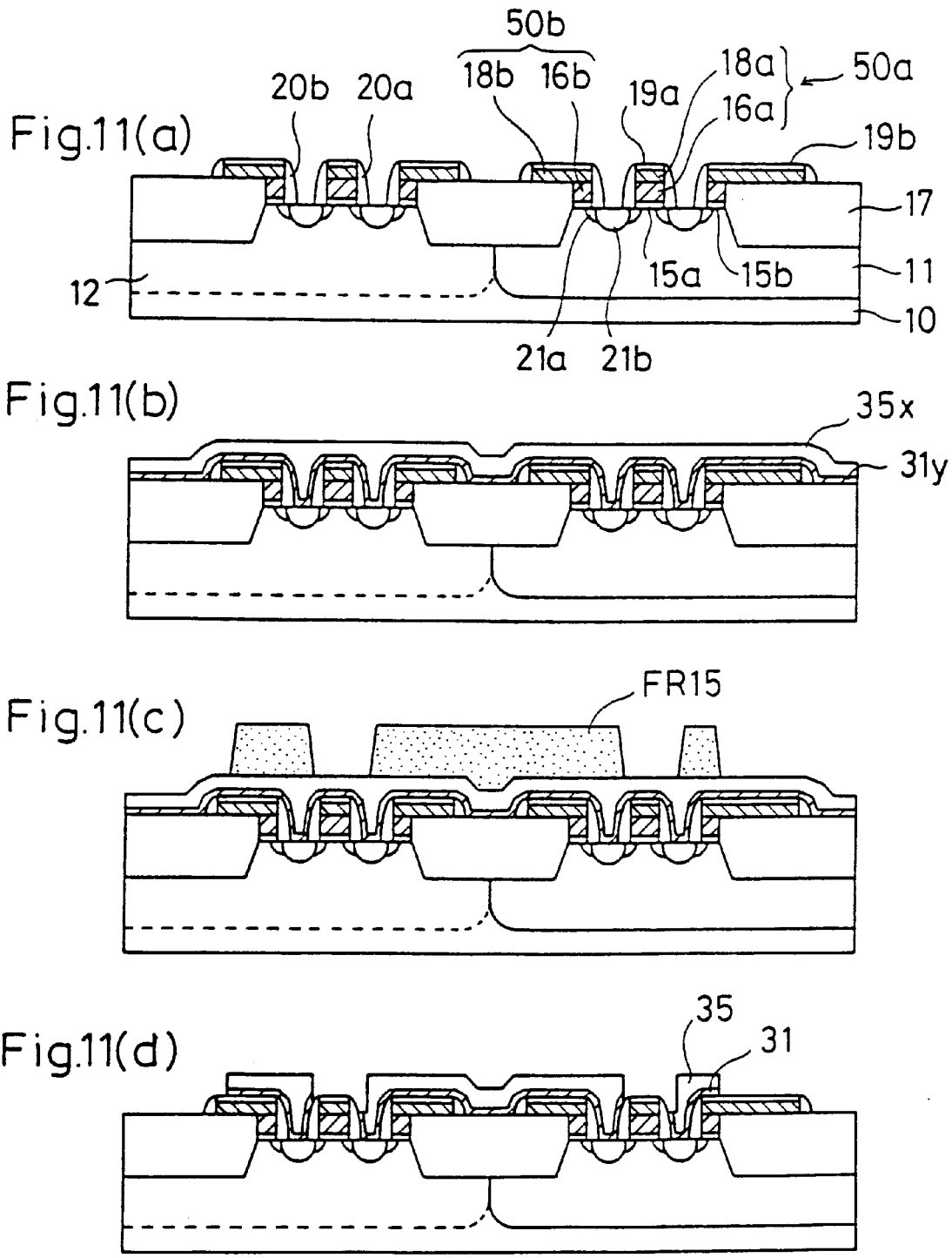

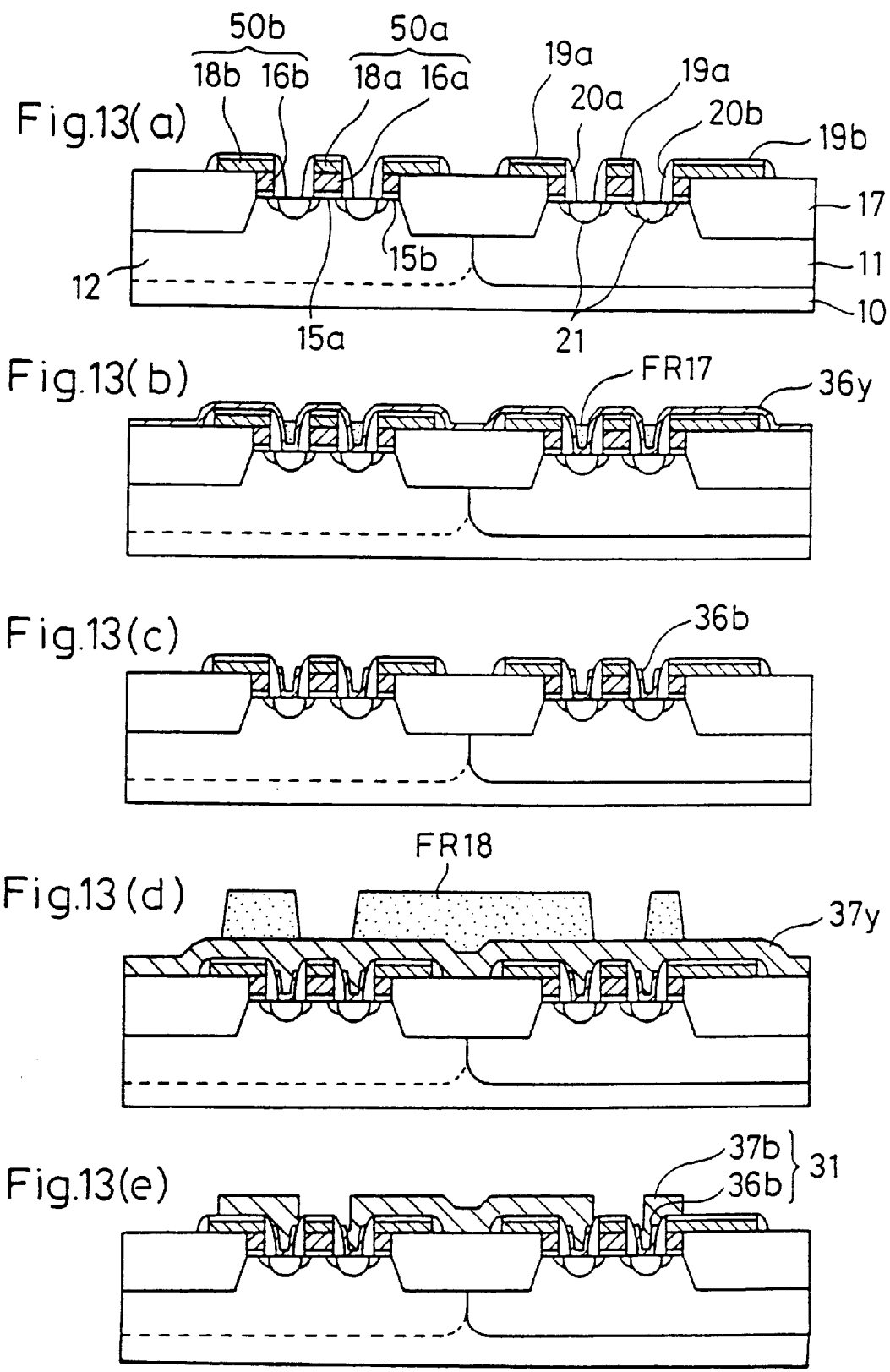

5,946,563

SEMICONDUCTOR DEVICE AND METHOD OF MANUFACTURING THE SAME

This is a divisional application of application Ser. No. 08/574,368, filed Dec. 18, 1995, U.S. Pat. No. 5,698,902.

BACKGROUND OF THE INVENTION

The present invention relates to a semiconductor device with a MOS transistor mounted thereon and a method of manufacturing the same. More particularly, it relates to a method of implementing a semiconductor device of superhigh integration which is operable at higher speed and exhibits stabilized device characteristics.

As higher integration and higher-speed operation have been required of semiconductor devices in recent years, transistors and wires mounted thereon and connection holes formed therein have been increasingly miniaturized. For instance, a MOS transistor having a reduced gate length of 0.4 μm has been implemented on a manufacturing level.

To achieve further miniaturization, it is required from the viewpoint of the manufacturing apparatus to use exposing light at a shorter wavelength and an improved exposure method in the photolithographic process for patterning a gate electrode. In principle, a light source which generates light at a shorter wavelength is more suitable for exposure. At present, exposing light at the shortest wavelength in practical use is an i line (at a wavelength of 365 nm) radiated from a mercury lamp. On the other hand, a KrF eximer laser beam has reached a point where it is substantially practical.

To provide an improved exposure method, new technology has been proposed and developed which increases resolving power by modifying optical systems and thereby forms a micropattern smaller in size than the wavelength of exposing light. For example, the modified illumination method is based on the principle of optical microscopy using the interference of two luminous fluxes, which involves the use of obliquely incident light for exposure in order to increase resolving power. On the other hand, the phase shift method uses a phase shifter provided on a mask in order to cause an interference between light that has passed through the phase shifter and hence in inverted phase and light that has not passed through the phase shifter, thereby increasing resolving power for separating openings in the mask. With these methods, the depth of focus is increased and a clear image can be formed constantly on a photoresist film even when the thickness of the photoresist film slightly varies from one place to another. In accordance with the methods, therefore, it is possible in principle to form a micropattern with about 0.3 μm minimum features by using, e.g., the i line.

Miniaturization has also been pursued in the structure of a MOS transistor to implement a microstructure suitable for practical use. Referring now to the drawings, a description will be given to a conventional semiconductor device and a manufacturing method thereof for achieving higher integration and high-speed operation.

FIG. 14 is a cross sectional view showing the structure of a conventional single MOS transistor. Below, the structure shown in FIG. 14 and the manufacturing method for implementing the structure will be roughly described.

Initially, an isolation 17 composed of a silicon dioxide film with a thickness of about 400 nm is formed by a LOCOS method on a semiconductor substrate 10. Then, a silicon dioxide film with a thickness of 10 nm and a polysilicon film with a thickness of 300 nm are successively deposited in this order. The polysilicon film and silicon dioxide film are selectively removed by subsequent photolithographic and etching processes, thereby forming a gate insulating film 15 and a gate electrode 50. At this stage, impurity ions at a low concentration are implanted using the gate electrode 50 as a mask so as to form LDD regions 21a. Thereafter, a silicon dioxide film with a thickness of about 150 nm is deposited by CVD over the entire surface, which is then etched back to form sidewalls 20. Subsequently, impurity ions at a high concentration are implanted into the semiconductor substrate 10 by using the gate electrode 50 and sidewalls 20 as a mask, thereby forming source/drain regions 21b. Next, an interlayer insulating film 32 is deposited and subjected to photolithographic and etching processes for opening contact holes therein, followed by the formation of metal buried layers 33 and the formation of aluminum interconnections 34 to be connected to the metal layers.

FIG. 15 is a plan view showing an example of the layout of a conventional semiconductor device on which a plurality of MOS transistors formed by the above manufacturing method are mounted.

In the example shown in the drawing, three transistors TR1 to TR3 are formed in a common first active region Rea1, while one transistor TR4 is formed isolated in a second active region Rea2. The semiconductor device formed by the conventional manufacturing method is so constituted that the source/drain regions 21b of the MOS transistors are connected to the corresponding upper metal interconnections 34 via the buried layers 33 in the contact holes.

Since the above structure suppresses a so-called narrow channel effect, the gate length can be reduced advantageously.

However, although the conventional semiconductor device of the above structure enables reductions in size of individual components, the following two problems inhibit further miniaturization, i.e., higher integration of the whole semiconductor device which has taken full advantage of the improved resolving power achieved in the manufacturing apparatus described above.

The first problem is variations in size in the photolithographic and etching processes. More specifically, as features to be defined by processing are increasingly miniaturized in the photolithographic process, influences of a difference in level in the underlay, such as halation and standing-wave effect, and the dependence of the sizes of such components as the gate electrode on the pattern due to the proximity effect become more conspicuous. In the etching process also, it becomes difficult to suppress an effect which varies the etching rate depending on a variation in the surface area of a portion being etched, i.e., the microloading effect. As a result, the respective gate electrodes 50 of the four MOS transistors TR1 to TR4 shown in FIG. 15 actually have different sizes L1 to L4, though they are originally designed to have the same size. Below, a description will be given to the variations in size.

FIG. 16 shows, for comparison, a distribution of the finished sizes of the gate length in an isolated pattern and a distribution of the finished sizes of the gate length in a line-and-space pattern (with three lines) in the case where gate electrodes are patterned by lithographic method in a pattern in which the gate length is 0.4 μm. As shown in the drawing, the finished sizes of the gate length in the isolated pattern are shifted in such a direction that the central value thereof becomes larger than the central value of the finished sizes of the gate length in the line-and-space pattern by about 0.08 μm. Even in a common dense pattern (line-and-space pattern), the gate electrode 50 of the middle one of the three transistors TR1 to TR3 tends to have a length shorter than those of the gate electrodes 50 on both sides, since it is most susceptible to the influences including the proximity effect.

The sizes L1 to L4 are thus varied, the correlation of which is represented by L4>L3=L1>L2. Such variations in size are not reduced at the same ratio as the gate length is reduced. If miniaturization is pursued in defiance of such size variations, a relative error between the sizes of the individual components is increased, which may seriously affect the characteristics of the transistors.

The second problem is a displacement of masks in the photolithographic process. In contrast to remarkable progresses achieved in microprocessing technology, technology of mask alignment has not improved greatly in terms of accuracy. To prevent defective characteristics or a reduced yield resulting from a short circuit between the source/drain regions and the gate electrode or substrate, it is required to lay out the contact holes, the gate electrode, and an isolation region at least at minimum specified intervals. In other words, it is necessary to previously provide the designed size with a margin for mask alignment.

Accordingly, even with an improved exposure method and an improved structure of the source/drain regions, reductions in size of the gate electrode, connections holes, and the like, which are commensurate with the remarkable progresses in microprocessing technology, cannot be attained because of the above problems which present obstacles to miniaturization. At the present stage, the above two problems have become factors which inhibit higher integration and higher-speed operation of the whole semiconductor device and their influences become more serious as miniaturization increases.

SUMMARY OF THE INVENTION

It is therefore a first object of the present invention to provide a semiconductor device and a method of manufacturing the same which reduce variations in finished size of the gate electrode resulting from the use of different gate patterns in photolithographic and etching processes, which is one of the factors inhibiting higher integration and higher-speed operation of the semiconductor device, and thereby implement the ultimate device miniaturization with processing technology.

A second object of the present invention is to provide a semiconductor device and a method of manufacturing the same which eliminate a faulty connection resulting from a displacement of masks in forming the connection holes between the source/drain regions of the semiconductor device and upper interconnecting members, which is the other factor inhibiting higher integration and higher-speed operation of the semiconductor device, and thereby enable a reduction in the area occupied by the source/drain regions.

A first semiconductor device according to the present invention comprises: an active region formed in a part of a semiconductor substrate; at least one gate electrode formed on the above semiconductor substrate in the above active region; source/drain regions formed by introducing an impurity into portions of the above semiconductor substrate which are located on both sides of the above gate electrode; an isolation formed to protrude from a surface of the substrate in the above active region and to surround the above active region; and a pair of dummy electrodes formed to extend over the above isolation and the above active region and substantially in parallel with the above gate electrode.

In the above constitution, since at least one gate electrode and the dummy electrodes form a line-and-space pattern, variations in size of the gate electrodes caused by the proximity effect in the photolithographic process and the microloading effect in the etching process, each for manufacturing the semiconductor device, are suppressed. Accordingly, even when the gate electrode is reduced in size, the error is not thereby increased. Consequently, it becomes possible to eliminate the above proximity effect and microloading effect which inhibit the miniaturization of the gate in the semiconductor device.

In the above semiconductor device, there can be further provided: electrode sidewalls and dummy sidewalls formed on side faces of the above gate electrode and on side faces of the above dummy electrodes, respectively, each of the above electrode sidewalls and dummy sidewalls being made of an insulating material; and withdrawn electrodes formed in contact with the above electrode sidewalls and with the above dummy sidewalls and electrically connected to the above source/drain regions, each of the above withdrawn electrodes being made of a conductive material.

When connection is to be provided between the source/drain regions and the upper interconnections in the above structure, the lower withdrawn electrodes are formed by self alignment due to contact holes formed in the insulating film positioned therebetween. Since the withdrawn electrodes extend in contact with and along the sidewalls, a sufficiently large area can be covered even when the area occupied by the source/drain regions is reduced. Consequently, even when the area occupied by the source/drain regions has been reduced by the formation of the dummy electrodes, it is possible to further reduce the area occupied by the source/drain regions, i.e., the area occupied by the active region with no disadvantage. Therefore, higher integration of the whole semiconductor device is achieved, while variations in size are reduced by the formation of the dummy electrodes.

The above first semiconductor device can be so constituted that the above isolation is formed to protrude from the surface of the substrate in the above active region and that the above gate electrode and the above dummy electrodes are composed of respective lower films formed substantially flush with a top surface of the above isolation and respective upper films formed on the lower films, the lower films of the above dummy electrodes being in contact with side edges of the above isolation on the above active region, the upper films of the above dummy electrodes extending over the lower films of the above dummy electrodes and the above isolation.

In the above structure, since the lower film of each of the electrodes and the isolation constitute a planarized surface and the surface of the upper film of each of the electrodes further deposited thereon is also planarized in the process of manufacturing the semiconductor device, the photolithographic process can be performed over the planarized surface in patterning the electrodes. In this manner, variations in size produced under the influences of a difference in level in the underlay, such as the halation and standing-wave effect, can substantially be eliminated.

The above first semiconductor device is preferably constituted so that one gate electrode is disposed on the above active region and that the above gate electrode and the above dummy electrodes are arranged at substantially regular intervals.

The above first semiconductor device is preferably constituted so that a plurality of gate electrodes are disposed on the above active region and that the above plurality of gate electrodes and the above pair of dummy electrodes are arranged at substantially regular intervals.

In the above first semiconductor device, an interval between any adjacent two of the above electrodes is preferably equal to or smaller than 2.5 times the wavelength of exposing light used in a photolithographic process for forming the above gate electrode and the above dummy electrodes.

With the above structures, variations in size of the gate electrodes caused by the above-mentioned proximity effect and microloading effect can substantially be eliminated.

In the above first semiconductor device, a length of the above gate electrode is preferably equal to or smaller than 1.5 times the wavelength of exposing light used in a photolithographic process for forming the above gate electrode and the above dummy electrodes.

With the above structure, the depth of focus of exposing light with respect to the line-and-space pattern is increased. Consequently, even when the thickness of the photoresist film varies from one place to another, a clear image is formed constantly on a photoresist film, so that the accuracy with which the gate electrode is patterned is increased. As a result, the degree of integration of the semiconductor device is increased, while the operating speed thereof is particularly increased.

A second semiconductor device according to the present invention comprises: an active region formed in a part of a semiconductor substrate; at least one gate electrode formed on the above semiconductor substrate in the above active region and composed of an upper film and a lower film; source/drain regions formed by introducing an impurity into portions of the above semiconductor substrate which are located on both sides of the above gate electrode; an isolation formed to protrude from a surface of the substrate in the above active region to a level substantially flush with a top surface of the lower film of the above gate electrode and to surround the above active region; and electrode sidewalls and isolation sidewalls formed on side faces of the above gate electrode and on side faces of the above isolation, respectively, each of the above electrode sidewalls and isolation sidewalls being composed of an insulating film; and withdrawn electrodes formed in contact with the above electrode sidewalls and the above isolation sidewalls and electrically connected to the above source/drain regions.

In the above structure, since the lower film of each of the electrodes and the isolation constitute the planarized surface and the surface of the upper film of each of the electrodes deposited thereon is also planarized, the photolithographic process can be performed over the planarized surface in patterning the electrodes. In this manner, variations in size produced under the influences of a difference in level in the underlay, such as the halation and standing-wave effect, can substantially be eliminated. Since the withdrawn electrodes extend in contact with and along the sidewalls, a sufficiently large area can be covered even when the area occupied by the source/drain regions is reduced. Moreover, even when masks are displaced from each other in forming the withdrawn electrodes, a difference in level between the semiconductor substrate and the isolation prevents the portions immediately above the source/drain regions from being removed. In other words, since the withdrawn electrodes are brought into contact with the source/drain regions by self alignment, higher integration of the whole semiconductor device can be achieved.

The same preferred embodiments as applied to the above first semiconductor device can also be applied to the second semiconductor device.

A first method of manufacturing a semiconductor device according to the present invention comprises the steps of: forming an isolation which surrounds an active region on a semiconductor substrate; forming at least one gate electrode on the above active region, while simultaneously forming a pair of dummy electrodes which extend over the above active region and the above isolation and substantially in parallel with the above gate electrode; and forming source/drain regions by introducing an impurity into portions of the semiconductor substrate which are located on both sides of the above gate electrode.

By the above method, a first semiconductor device can be manufactured easily.

In the above first method of manufacturing a semiconductor device, there can be further provided the steps of: forming electrode sidewalls and dummy sidewalls on side faces of the above gate electrode and on side faces of the above dummy electrodes, respectively, each of the above electrode sidewalls and dummy sidewalls being made of an insulating material; and forming withdrawn electrodes which are brought into contact with the above source/drain regions by self alignment.

By the above method, the withdrawn electrodes which are brought into contact with the source/drain regions by self alignment can be formed over a large area so that the connection holes for providing connection between the upper interconnections and the withdrawn electrodes are formed easily. As a result, not only the upper metal interconnections can surely be brought into contact with the source/drain regions occupying a reduced area because of the formation of the dummy electrodes, but also the area occupied by the active region can further be reduced.

A second method of manufacturing a semiconductor device according to the present invention comprises the steps of: forming a gate insulting film and a first conductive film for gate successively on a semiconductor substrate; selectively etching the above first conductive film for gate, the above gate insulating film, and the above semiconductor substrate in a region in which an isolation is to be formed so as to form a trench; after forming an insulating film for isolation on the substrate formed with the above trench, removing the above insulating film for isolation till a surface of the above first conductive film for gate becomes exposed and a surface of the substrate is planarized so as to form the isolation from a part of the above insulating film for isolation left in the above trench; forming at least a second conductive film for gate on the above planarized substrate and selectively etching the above first and second conductive films for gate and the above gate insulating film so as to form a gate electrode from the above first and second conductive films for gate left on the above active region; introducing an impurity into portions of the semiconductor substrate which are located on both sides of the above gate electrode so as to form source/drain regions; forming electrode sidewalls and isolation sidewalls on side faces of the above gate electrode and on side faces of the above isolation, respectively, each of the above electrode sidewalls and isolation sidewalls being made of an insulating material; and forming withdrawn electrodes which are brought into contact with the above source/drain regions by self alignment.

By the above method, the second conductive film for gate is deposited on a surface planarized by the first conductive film for gate and isolation, so that photolithography and etching are performed with respect to the planarized surface so as to pattern the first and second conductive films for gate into the gate electrodes. Consequently, variations in size of the electrodes produced under the influences of a difference in level in the underlay, such as the halation and standing-wave effect, can be reduced to a substantially negligible degree. Moreover, since the first conductive film for gate functions as an etching stopper, the process is simplified.

A third method of manufacturing a semiconductor device according to the present invention comprises the steps of: forming an oxide film and an etching stopper film successively on a semiconductor substrate; selectively etching the above etching stopper film, the above oxide film, and the above semiconductor substrate in a region in which an isolation is to be formed so as to form a trench; after forming an insulating film for isolation on the substrate formed with the above isolation, removing the above insulating film for isolation till a surface of the above etching stopper film becomes exposed and a surface of the substrate is planarized so as to form the isolation from the above insulating film for isolation left in the above trench; after removing the above oxide film and the above etching stopper film, forming a gate insulating film and a first conductive film for gate successively on the substrate; removing the above first conductive film for gate and the above gate insulating film till at least a surface of the above isolation becomes exposed and the surface of the substrate is planarized; forming at least a second conductive film for gate on the above planarized substrate and selectively etching the above first and second conductive films for gate and the above gate insulating film so as to form a gate electrode from the above first and second conductive films for gate left on the above active region; introducing an impurity into portions of the semiconductor substrate which are located on both sides of the above gate electrode so as to form source/drain regions; forming electrode sidewalls and isolation sidewalls on side faces of the above gate electrode and on side faces of the above isolation, respectively, each of the above electrode sidewalls and isolation sidewalls being made of an insulating material; and forming withdrawn electrodes which are brought into contact with the above source/drain regions by self alignment.

By the above method, a damage to the gate insulating film accompanying the formation of the isolation can be avoided, while the adverse influence of thermal experience on the characteristics of the semiconductor device can be suppressed.

In each of the above methods of manufacturing semiconductor devices, the above step of forming the gate electrode and the dummy electrodes is preferably performed such that one gate electrode is formed on the above active region and that the gate electrode and the dummy electrodes are arranged at substantially regular intervals.

In each of the above methods of manufacturing semiconductor devices, the above step of forming the gate electrode and the dummy electrodes is preferably performed such that a plurality of gate electrodes are formed on the above active region and that the gate electrodes and the dummy electrodes are arranged at substantially regular intervals.

By the above methods, variations in size of the electrodes caused by the proximity effect occurring in photolithography and the microloading effect occurring in etching can substantially be eliminated.

In each of the above methods of manufacturing semiconductor devices, the above etching stopper film is preferably composed of at least any one of a silicon nitride film, a polysilicon film, an amorphous silicon film, a metal film, a metal compound film, a PSG film, and a BPSG film.

In each of the above methods of manufacturing semiconductor devices, the above second conductive film for gate is preferably composed of at least any one of a metal film, a metal compound film, a polysilicon film, and an amorphous silicon film.

In each of the above methods of manufacturing semiconductor devices, the above step of forming the withdrawn electrodes preferably consists of the steps of: forming respective lower films, each composed of a first conductive film, which are brought into contact with the above source/drain regions; and forming, on the above lower films, respective upper films each composed of a second conductive film which has an etching selectivity higher than that of the above first conductive film.

By the above method, if the electric resistivities and etching properties of the first and second conductive films are selected as necessary, it becomes possible to form a semiconductor device in which a contact resistance between the first and second conductive films and the source/drain regions has been reduced and the area occupied by the source/drain regions has been reduced.

In this case, in the above step of forming the lower films of the withdrawn electrodes, the first conductive film may be formed on the substrate and then etched back so as to leave the above first conductive film only in portions immediately above the above source/drain regions.

In the above step of forming the lower films of the withdrawn electrodes, it is possible to form the first conductive film on the substrate, form a member for masking on the above first conductive film, etch back the entire surface of the above member for masking so that it is left only in portions above the above source/drain regions, and then etch the above first conductive film by using the remaining member for masking.

By the above methods, the lower films to be brought into contact with the source/drain regions are formed by self alignment, on which is formed the second conductive film. Since the source/drain regions are covered with the lower films in patterning the second conductive film into the upper films of the withdrawn electrodes, the source/drain regions are not exposed even when masks are displaced from each other in forming the withdrawn electrodes, which prevents a faulty connection or the like.

In each of the above methods of manufacturing semiconductor devices, the above step of forming the withdrawn electrodes can consist of the steps of: forming a conductive film for withdrawn electrodes on the substrate; forming an amorphous film on the above conductive film for withdrawn electrodes; and sequentially etching the above amorphous film and the above conductive film for withdrawn electrodes by using a common mask which covers respective regions in which the withdrawn electrodes are to be formed.

By the above method, since the underlay of the masking member in forming the withdrawn electrodes is composed of an amorphous film with excellent flatness, the withdrawn electrodes can be formed more easily with higher fidelity.

BRIEF DESCRIPTION OF THE DRAWINGS

FIG. 5 is a plan view showing the layout of a semiconductor device according to a second embodiment;

FIG. 6 is a cross sectional view of the semiconductor device taken along the line VI—VI shown in FIG. 5;

FIGS. 7(a) to 7(f) are cross sectional views illustrating a process of manufacturing the semiconductor device according to the second embodiment up to the step of forming a trench isolation;

FIGS. 8(a) to 8(e) are cross sectional views illustrating the process of manufacturing the semiconductor device according to the second embodiment between the step of forming the trench isolation and the step of forming sidewalls;

FIGS. 9(a) to 9(e) are cross sectional views illustrating the process of manufacturing the semiconductor device according to the second embodiment after the step of forming the sidewalls;

FIGS. 10(a) to 10(g) are cross sectional views illustrating a process of manufacturing a semiconductor device according to a third embodiment up to the step of forming a trench isolation;

FIGS. 11(a) to 11(d) are cross sectional views illustrating the process of forming withdrawn electrodes in a semiconductor device according to a fourth embodiment;

FIGS. 13(a) to 13(e) are cross sectional views illustrating the process of forming withdrawn electrodes in the semiconductor device according to the fifth embodiment;

DETAILED DESCRIPTION OF THE INVENTION (First Embodiment)

A description will be given first to a first embodiment with reference to FIGS. 1(a) to 1(e) and to FIGS. 2 to 4. FIGS. 1(a) to 1(e) are cross sectional views illustrating a process of manufacturing a semiconductor device according to the first embodiment, in which only the structure in the vicinity of a MOS transistor having a gate electrode in an isolated pattern is shown.

Figure 1:
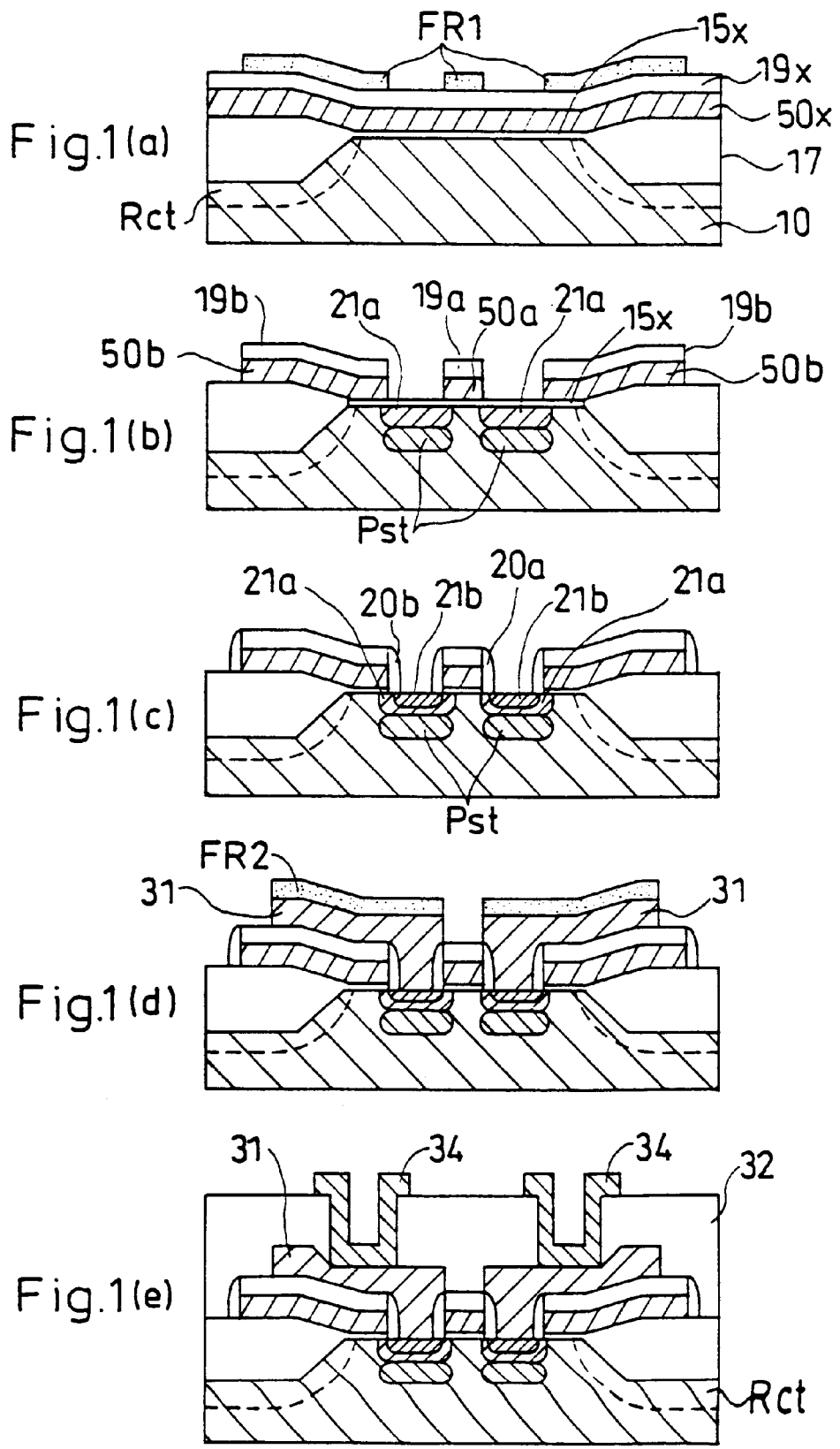
FIGS. 1($a$) to 1($e$) are cross sectional views showing a process of manufacturing a semiconductor device according to a first embodiment.

Initially, as shown in FIG. 1(a), an isolation 17 composed of a LOCOS film is formed on a semiconductor substrate 10 made of P-type single-crystal silicon so as to define an active region. Into the active region are implanted impurity ions for threshold control. Into the portion beneath the isolation 17 are implanted impurity ions at a concentration higher than the impurity concentration for threshold control, thereby forming channel stopper regions Rct. Thereafter, a silicon dioxide film 15x is formed over the active region of the semiconductor substrate 10, followed by the deposition of a polysilicon film 16x and a protective silicon dioxide film 19x thereon. Subsequently, a photoresist film FR1 is formed on the protective silicon dioxide film 19x by photolithography so as to cover only the regions in which the polysilicon film 50x and the protective silicon dioxide film 19x are to be left.

Next, as shown in FIG. 1(b), dry etching is performed to selectively remove the above polysilicon film 50x and protective silicon dioxide film 19x in the regions corresponding to the openings of the above photoresist film FR1, thereby forming a gate electrode 50a and a gate protective film 19a on the active region, while forming dummy electrodes 50b and dummy protective films 19b such that they extend over the active region and the isolation 17. After that, N-type impurity ions ($P^+$ or $As^+$) at a low concentration are implanted using the electrodes 50a and 50b as a mask, thereby forming LDD regions 21a in these portions of the semiconductor substrate 10 which are located on both sides of the gate electrode 50a. Furthermore, P-type impurity ions ($B^+$) are implanted with high energy, thus forming punch-through stoppers Pst beneath the LDD regions 21a.

Next, as shown in FIG. 1(c), a silicon dioxide film (not shown) is deposited on the substrate and then etched back, thereby forming electrode sidewalls 20a on the side faces of the gate electrode 50a, while forming dummy sidewalls 20b on the side faces of the dummy electrode 50b. Thereafter, N-type impurity ions ($P^+$ or $As^+$) at a high concentration are implanted using the electrodes and the sidewalls as a mask so as to form source/drain regions 21b.

Next, as shown in FIG. 1(d), a multi-layer metal film consisting of W/TiN/Ti films is deposited on the substrate, followed by a photolithographic process for forming a photoresist film FR2 and a dry etching process for selectively removing the multi-layer metal film, thereby forming withdrawn electrodes 31 for contact with the above source/drain regions.

Next, as shown in FIG. 1(e), an interlayer insulating film 32 is deposited on the substrate, followed by the formation of contact holes in desired positions. After depositing a metal film on the inner surfaces of the contact holes and over the interlayer insulating film 32, upper metal interconnections 34 are patterned.

Figure 16:
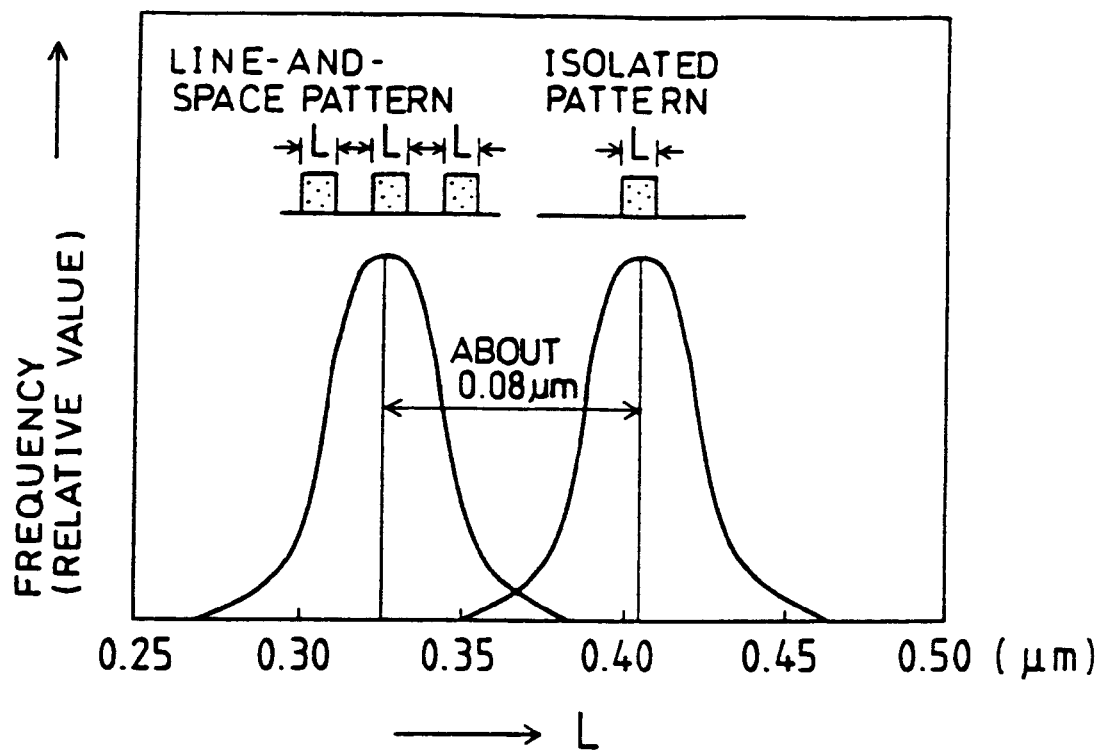
FIG. 16 is a graph for illustrating a difference in size between the gate electrodes in a dense pattern and the gate electrodes in an isolated pattern in the conventional semiconductor device.

As described above, the finished sizes of the gate length in the isolated pattern and in a line-and-space pattern have a dependence on the pattern, which is shown in FIG. 16. However, since the present embodiment has formed the dummy electrodes 50b on both sides of the isolated gate electrode 50a, the gate electrode 50a is positioned at the center of the line-and-space pattern in any portion, so that a pattern shift which increases the size of the gate electrode 50a can effectively be prevented.

Figure 2:
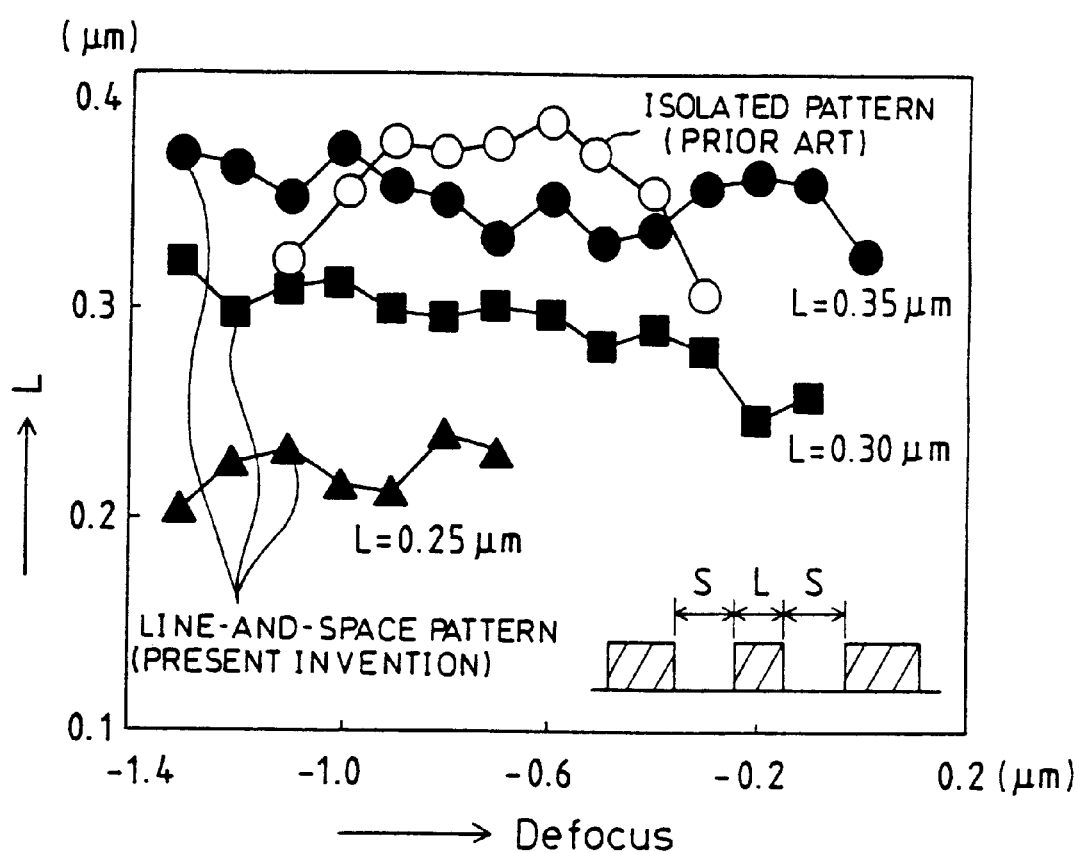
FIG. 2 is a graph showing the dependence of the sizes of processed gate electrodes on a depth of focus in the semiconductor device according to the first embodiment.

FIG. 2 shows, for comparison, depths of focus obtained when the gate electrode of a transistor in the conventional isolated pattern and the gate electrodes of transistors in the line-and-space pattern of the present embodiment were patterned using an i line as exposing light and a reticle in a pattern in which gate lengths L are 0.25 $\mu$m, 0.3 $\mu$m, and 0.35 $\mu$m. In the transistors of the present embodiment, however, the spacing S between the gate electrode 50a and the adjacent dummy electrode 50b has been set to 0.4 $\mu$m.

As can be seen from the drawing, when the gate length is 0.35 $\mu$m, a depth of focus (within the range of 10% of the finished size) of 1.5 $\mu$m or more is provided in the transistors of the present embodiment, while the depth of focus is 0.6 $\mu$m in the conventional isolated pattern (in general, a minimum depth of focus required for manufacturing is about 1.2 $\mu$m). Moreover, it is also possible to form a gate electrode having a length of 0.3 $\mu$m or less which cannot be resolved in the conventional isolated pattern when an i line is used. Consequently, with the structure of the present embodiment, a gate electrode having a dimension equal to or shorter than the wavelength of exposing light can be patterned, while the depth of focus can be increased in a transistor having a gate length larger than the wavelength of exposing light.

Figure 3:
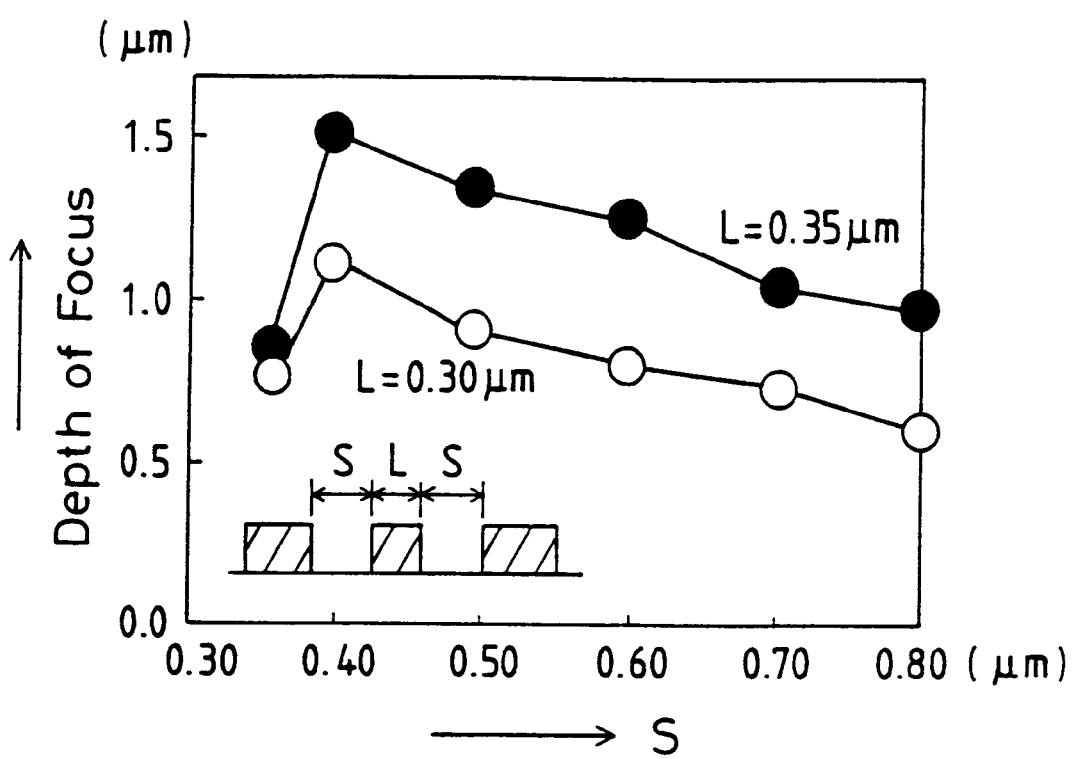
FIG. 3 is a graph showing the dependence of the depth of focus on the spacing between electrodes in the case of using an i line in the semiconductor device according to the first embodiment.

FIG. 3 shows the dependence of the depth of focus on the spacing S between the gate electrode and the adjacent dummy electrode according to the present embodiment, which are patterned using an i line as exposing light and a reticle in a pattern in which the gate lengths L are 0.3 $\mu$m and 0.35 $\mu$m. As can be seen from the drawing, the depth of focus is increased as the spacing S becomes smaller till it reaches a maximum value when the spacing S is 0.4 $\mu$m. The depth of focus is reduced whether the spacing S becomes smaller or larger than 0.4 $\mu$m.

Figure 4:
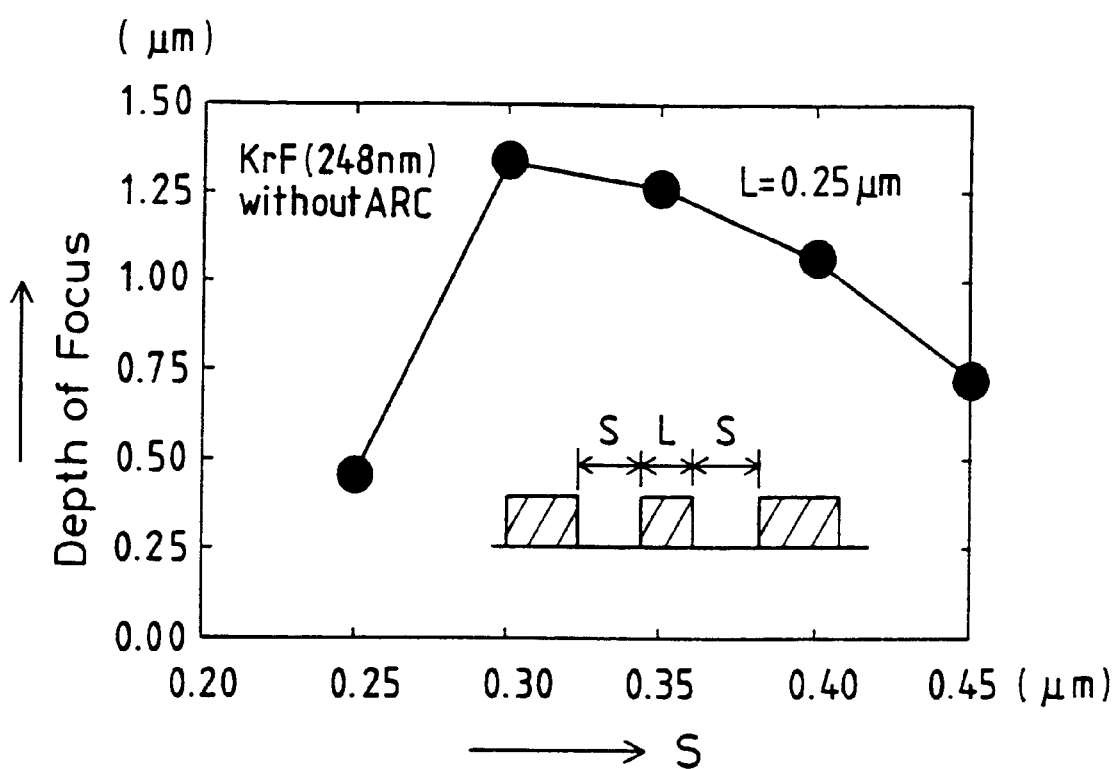
FIG. 4 is a graph showing the dependence of the depth of a focus on the spacing between the electrodes in the case of using a KrF beam in the semiconductor device according to the first embodiment.

FIG. 4 shows the dependence of the depth of focus on the spacing S between the gate electrode and the adjacent dummy electrode according to the present embodiment, which are patterned using a KrF beam as exposing light and a reticle in a pattern in which the gate length L is 0.25 $\mu$m. In this case, the depth of focus reaches a maximum value when the spacing S between the electrodes is about 0.3 $\mu$m. Thus, it has been confirmed that the spacing S between the electrodes has an optimum value which is dependent on the wavelength of the exposing light rather than on the gate length.

As a result, in order to form a gate pattern with high accuracy, the spacing S between the gate electrode and the adjacent dummy electrode is preferably set to a value equal to or smaller than 2.5 times the wavelength of exposing light. On the other hand, the present invention exerts the effect of reducing variations in gate length particularly remarkably when the gate length L is equal to or smaller than 1.5 times the wavelength of exposing light.

By thus implementing the line-and-space pattern provided with the dummy electrodes 50b, the size of the gate electrode 50a can be uninformed, while the area occupied by the source/drain regions 21b is reduced. In the conventional method of manufacturing a transistor, however, it has been required to provide the source/drain regions with a considerably large area compared with the connection holes in consideration of a displacement of masks during the manufacturing process, since the connection holes are formed to reach the source/drain regions for direct contact. The use of such a structure provided with the dummy electrodes 50b in the conventional method necessitates further provision of a margin for the area occupied by the entire active region, which may eventually inhibit higher integration of the whole semiconductor device.

In the present embodiment, by contrast, contact with the source/drain regions 21b is made through the contact holes formed below the withdrawn electrodes 31, as shown in FIG. 1(d). Since the withdrawn electrodes 31 are brought into contact with the source/drain regions 21b by self alignment, a mask for bringing the withdrawn electrodes 31 into contact with the source/drain regions 21b is unnecessary. Moreover, since the withdrawn electrodes 31 can be formed to cover a large area extending from the sidewalls 20 to the dummy electrodes 50b, the formation of the contact holes leading to the withdrawn electrodes 31 is significantly facilitated, which eliminates the necessity for considering a displacement of masks. Furthermore, since the source/drain regions 21b are formed apart from the isolation 17, they are no more in contact with the channel stopper regions Rct formed beneath the isolation 17 by introducing an impurity of a conductivity type opposite to that of the source/drain regions, thus reducing the capacitance of the side face of the source/drain regions 21b. In other words, an operating speed can be increased by reducing a parasitic capacitance.

Since the use of the line-and-space pattern in which the dummy electrodes 50a are formed on both sides of the gate electrode 50a reduces variations in finished size of the gate electrode 50a, no relative error is increased by reducing the gate length. Even though the area occupied by the source/drain regions 21b is reduced by the formation of the dummy electrodes 50b, the provision of the withdrawn electrodes 31 which are brought into contact with the source/drain regions by self alignment eliminates the necessity to enlarge the area occupied by the source/drain region 21b. On the contrary, it is possible to further reduce the area occupied by the source/drain regions 21b positively.

Thus, the area of the active region can be reduced by reducing the size of the gate electrode 50a as well as the area occupied by the source/drain regions 21b.

Moreover, it is also possible to reduce the size of the isolation 17 since the function of the channel stopper regions beneath the isolation 17 is enhanced.

In this manner, the degree of integration and the operating speed of the whole semiconductor device can be increased.

(Second Embodiment)

Below, a second embodiment will be described. A description will be given first to the structure of a semiconductor device according to the present embodiment with reference to FIGS. 5 and 6.

FIG. 5 is a plan view of a region including a transistor in an isolated area and transistors in a dense area in the semiconductor device according to the present embodiment. As shown in the drawing, the three transistors TR1 to TR3 are formed densely in the first active region Rea1, while a single transistor TR4 is formed isolated in the second active region Rea2. In the first active region Rea1, the respective gate electrodes 50a of the transistors TR1 to TR3 are arranged in parallel at regular spacings So, while the dummy electrodes 50b are provided over the first active region Rea1 and the isolation so as to be contiguous to the transistors TR1 and TR3 on both sides. In the second active region Rea2, the gate electrode 50a of the isolated transistor TR4 is formed, while the two dummy electrodes 50b are formed over the active region Rea2 on both sides thereof and the isolation. In the present embodiment, however, the dummy electrodes 50b are used in common over the isolation between the first active region Rea1 and the second active region Rea2. The spacing between each of the gate electrodes 50a and the adjacent dummy electrode 50b is equal to the spacing So between the two adjacent gate electrodes 50a. In short, the spacing between the two adjacent gate electrodes 50a and the spacing between the gate electrode 50a and the adjacent dummy electrode 50b have been set to the specified value So.

As shown in FIG. 6 which will be described later, the withdrawn electrodes 31 are formed for contact with respective parts of the active regions Rea1 and Rea2 and the upper metal interconnections 34 are connected to the withdrawn electrodes 31 via the buried layers 33.

FIG. 6 is a cross sectional view of the structure in the vicinity of the isolated transistor TR4 taken along the line VI—VI of FIG. 5. As shown in FIG. 6, on the semiconductor substrate 10 is formed the isolation 17 in the form of a trench having the top surface higher in level than the top surface of the semiconductor substrate 10. In the active region surrounded by the isolation 17 is formed a single MOS transistor. The MOS transistor comprises: the gate electrode 50a consisting of a lower film 16a composed of a polysilicon film and an upper film 18a composed of a tungsten film; and the dummy electrodes 50b each consisting of a lower film 16b composed of a polysilicon film and an upper film 18b composed of a tungsten film. The lower film 16b of the above dummy electrode 50b extends along the side edge of the isolation 17 and its top surface is flush with the top surface of the isolation 17. The upper film 18b of the dummy electrode 50b is formed over the lower film 16b and the isolation 17. On the gate electrode 50a and dummy electrodes 50b are formed the protective insulating film 19a and protective insulating films 19b, respectively, each composed of a silicon dioxide film. Beneath the gate electrode 50a and dummy electrodes 50b are formed a gate insulating film 15a and dummy insulating films 15b, respectively, each composed of a silicon dioxide film. On the side faces of the gate electrode 50a and on the side faces of the dummy electrodes 50b are formed the electrode sidewalls 20a and the dummy sidewalls 20b, respectively, each composed of a silicon dioxide film. In these portions of the semiconductor substrate 10 which are located on both sides of the gate electrode 50a are formed the LDD regions 21a, the source/drain regions 21b, and the withdrawn electrodes 31 composed of W/Ti films which are brought into contact with the source/drain regions 21b by self alignment. The withdrawn electrodes 31 are formed over a large area including parts of the dummy electrodes 50b. Above the withdrawn electrodes 31 are formed the upper metal interconnections 34 via the interlayer insulating films 32. The upper metal interconnections 34 are connected to the withdrawn electrodes 31 by the buried layers 33 made of tungsten in the connection holes.

Thus, the semiconductor device according to the present embodiment is so constituted that the withdrawn electrodes 31, which are contiguous to the sidewalls 20a and 20b formed on the side faces of the gate electrode 50a and dummy electrodes 50b of the MOS transistor, are brought into contact with the source/drain regions 21b by self alignment. The dummy electrodes 50b are formed to extend over the active region of the semiconductor substrate 10 and the isolation 17 in each of the isolated area and dense area. Since the gate electrode 50a and dummy electrodes 50b constitute the line-and-space pattern, the same effect as achieved in the first embodiment can also be achieved in the present embodiment.

Moreover, since the spacing between the two adjacent gate electrodes 50a and the spacing between the gate electrode 50a and the adjacent dummy electrode sob are set to the specified value So on the active region, variations in size of the gate electrode 50a caused by the proximity effect in the photolithographic process or by the microloading effect in the etching process are seldom produced on the active region. Consequently, even when the length of the gate electrode 50a is reduced, the use of the isolated gate pattern and the dense gate pattern causes no difference in the above two effects, so that the size error is not increased. As a result, further miniaturization of the transistor is enabled so as to increase the degree of integration and operating speed of the semiconductor device. Furthermore, size accuracy can also be improved by increasing the degree of planarization during the manufacturing process.

Next, a description will be given to a method of manufacturing the semiconductor device according to the present embodiment with reference to FIGS. 7(a) to 7(f), FIGS. 8(a) to 8(e), and FIGS. 9(a) to 9(e). In each of the drawings, however, the description will be limited to the manufacturing process in an area in which an N-channel MOS transistor and a P-channel MOS transistor are formed contiguous to each other, i.e., in an area not shown in FIGS. 5 and 6.

Initially, as shown in FIG. 7(a), a photoresist film FR3 is formed on the semiconductor substrate 10 so as to cover a region Rn in which the N-channel MOS transistor is to be formed, followed by the implantation of phosphorus ions ($P^+$) into the region Rn. After that, as shown in FIG. 7(b), a photoresist film FR4 is formed to cover a region Rp in which the P-channel MOS transistor is to be formed, followed by the implantation of boron ions ($B^+$) into the region Rp. As a result, an N-well 11 and a P-well 12, in each of which the concentration of the impurity is set to a value for threshold control, are formed in the surface region of the semiconductor substrate 10.

Next, as shown in FIG. 7(c), the entire surface of the substrate is oxidized to form a silicon dioxide film 15x with a thickness of 10 nm, on which is subsequently deposited a polysilicon film 16x (first conductive film for gate) to a thickness of 300 nm. Thereafter, as shown in FIG. 7(d), a photoresist film FR5 with openings corresponding to the region in which the isolation is to be formed is formed on the polysilicon film 16x. The polysilicon film 16x, silicon dioxide film 15x, and semiconductor substrate 10 are then sequentially etched, thereby partially removing the semiconductor substrate 10 and forming a trench having a depth of about 300 nm.

Next, as shown in FIG. 7(e), a silicon dioxide film 17x for isolation (insulating film for isolation) with a thickness of about 1 μm is deposited on the substrate by CVD. After coating a photoresist on the entire surface of the silicon dioxide film 17x, the resulting photoresist film and the silicon dioxide film 17x are removed by etch back till the polysilicon film 16x becomes exposed, thereby planarizing the surface of the substrate as shown in FIG. 7(f). At this stage, there has been formed the isolation 17 in the form of a trench which surrounds the active region. After that, channel stopper layers are formed beneath the isolation 17, though the drawing thereof is omitted here. Specifically, an N-type impurity at a concentration higher than the impurity concentration in the N-well 11 is introduced by ion implantation into the portion beneath the isolation 17 in the N-well 11, while a P-type impurity at a concentration higher than the impurity concentration in the P-well 12 is introduced by ion implantation into the portion beneath the isolation 17 in the P-well 12. However, the channel stopper layers may also be formed in another step.

Next, as shown in FIG. 8(a), a tungsten film 18x (second conductive film for gate) with a thickness of 100 nm and a protective silicon dioxide film 19x with a thickness of 150 nm are formed successively on the substrate, on which is further formed a photoresist film FR6 which covers the regions in which the tungsten film 18x is to be left. Then, by using the photoresist film FR6 as a mask, the protective silicon dioxide film 19x, tungsten film 18x, polysilicon film 16x, and silicon dioxide film 15x are sequentially etched to be selectively removed. Next, as shown in FIG. 8(b), the gate electrode 50a consisting of the lower film 16a and upper film 18a is formed on the active region, while the dummy electrodes 50b composed of the lower films 16b and upper films 18b are formed to extend over the active region and the isolation 17. Between the gate electrode 50a and the semiconductor substrate 10 is interposed the gate insulating film 15a, while the dummy insulating films 15b are interposed between the dummy electrodes 50b and the semiconductor substrate 10.

Next, as shown in FIG. 8(c), the photoresist film FR7 is formed to cover the region Rn in which the N-channel MOS transistor is to be formed. Subsequently, boron ions ($B^+$) at a low concentration are implanted using the photoresist film FR7 and the gate electrode 50a and dummy electrodes 50b of the P-channel MOS transistor as a mask, thereby forming the LDD regions 21a of the P-channel MOS transistor.

Thereafter, as shown in FIG. 8(d), a photoresist film FR8 is formed to cover the region Rp in which the P-channel MOS transistor is to be formed. Then, by using the photoresist film FR8 and the gate electrode 50a and dummy electrodes 50b of the N-channel MOS transistor as a mask, phosphorus ions ($P^+$) at a low concentration are implanted, thereby forming the LDD regions 21a of the N-channel MOS transistor.

Next, as shown in FIG. 8(e), a silicon dioxide film with a thickness of 100 nm is formed on the substrate by CVD and then etched back so as to form the electrode sidewalls 20a and the dummy sidewalls 20b on the side faces of the gate electrode 50a and on the side faces of the dummy electrodes 50b, respectively. On the exposed portions of the side faces of the isolation 17 are formed isolation sidewalls, though the drawing thereof is omitted here.

Subsequently, as shown in FIG. 9(a), a photoresist film FR9 is formed to cover the region Rn in which the N-channel MOS transistor is to be formed. Then, by using the resulting photoresist film FR9, the gate electrode 50a and dummy electrodes 50b of the P-channel MOS transistor, and the sidewalls 20a and 20b as a mask, boron ions ($B^+$) at a high concentration are implanted, thereby forming the source/drain regions 21b of the P-channel MOS transistor. After that, as shown in FIG. 9(b), a photoresist film FR10 is formed to cover the region Rp in which the P-channel MOS transistor is to be formed. Then, by using the photoresist film FR10, the gate electrode 50a and dummy electrode 50b of the N-channel MOS transistor, and the sidewalls 20a and 20b as a mask, arsenic ions ($As^+$) at a high concentration are implanted, thereby forming the source/drain regions 21b of the N-channel MOS transistor.

Next, as shown in FIG. 9(c), a multi-layer metal film 31x consisting of W/TiN films is deposited on the substrate, followed by the formation of a photoresist film FR11 with openings corresponding to the regions in which the withdrawn electrodes are to be formed. Then, as shown in FIG. 9(d), the multi-layer metal film 31x is etched using the photoresist film FR11 as a mask, thereby forming the withdrawn electrodes 31 which are brought into contact with the source/drain regions 21b by self alignment and extend over the dummy electrodes 50b.

Next, as shown in FIG. 9(e), the interlayer insulating film 32 is deposited over the substrate, followed by the formation of the contact holes penetrating the insulating film 32 and leading to the withdrawn electrodes 31. The resulting contact holes are buried with tungsten to form the buried layers 33, while the upper metal interconnections 34 composed of aluminum alloy films are formed.

In the manufacturing process of the present embodiment, since the isolation 17 is so constituted that the top surface thereof protrudes from the top surface of the semiconductor substrate 10 in the active region, the underlay is planarized in the step of forming the gate electrode shown in FIG. 8(a), so that variations in size of the individual gate electrodes 50a caused by halation and standing-wave effect in the photolithographic process can be reduced to a negligible degree. In particular, since the polysilicon film 16x constituting a part of the gate electrode 50a also functions as an etching stopper in forming the trench for the isolation 17, the number of processing steps can advantageously reduced in the present embodiment.

Since the substrate surface in the source/drain regions 21b is positioned lower than the top surface of the isolation 17 by the thickness of the polysilicon film 16, the manufacturing process of the present embodiment provides the following effects. That is, in the step of patterning the multi-layer metal film 31x shown in FIGS. 9(c) to 9(d) into the withdrawn electrodes 31, even if the photoresist film FR11 is displaced from the positions of the source/drain regions 21b and hence portions uncovered with the photoresist film FR11 are observed above the source/drain regions 21b, the multi-layer metal film 31x above the uncovered portions are not completely etched away. On the other hand, since the withdrawn electrodes 31 are brought into contact with the source/drain regions 21b by self alignment, no extra margin is needed for a displacement of masks.

Although the present embodiment has set the spacing between the two adjacent gate electrode 50a and the spacing between the gate electrode 50a and the adjacent dummy electrode 50b to the specific value So, these spacings may be set at different values. Since the provision of the dummy electrodes 50b has allowed any gate electrode 50a to be formed in a line-and-space pattern, the proximity effect is exerted on the individual gate electrodes 50a. As a result, even when the above spacings between the electrodes are slightly different from each other, variations in gate length can surely be reduced. By optimizing the spacing between the gate electrode 50a and the isolation 17 and the difference in level between the substrate surface in the source/drain regions 21b and the top surface of the isolation 17, i.e., the thickness of the polysilicon film 16x and the thickness of the multi-layer metal film 31x, the withdrawn electrodes 31 can be formed by self alignment, so that the same effect as achieved in the present embodiment can be achieved.

(Third Embodiment)

Below, a description will be given to a third embodiment with reference to FIGS. 10(a) to 10(g) which illustrate the process of manufacturing a semiconductor device according to the present embodiment.

Initially, as shown in FIG. 10(a), the surface of the semiconductor substrate 10 is oxidized to form a silicon dioxide film 12x with a thickness of 20 nm on which is deposited a silicon nitride film 14x (etching stopper film) with a thickness of 300 nm. Subsequently, as shown in FIG. 10(b), a photoresist film FR12 with openings corresponding to the region in which the isolation is to be formed is formed to be used as a mask in sequentially etching the silicon nitride film 14x, the silicon dioxide film 13x, and the semiconductor substrate 10, thereby forming a trench having a depth of about 300 nm in the semiconductor substrate 10.

Next, as shown in FIG. 10(c), a silicon dioxide film with a thickness of about 1 $\mu$m is deposited on the substrate by CVD. After coating a photoresist thereon, the photoresist film and the silicon dioxide film are etched back till the silicon nitride film 14x becomes exposed, thereby planarizing the substrate surface.

Subsequently, as shown in FIG. 10(d), the silicon nitride film 14x remaining on the active region is removed and a photoresist film FR13 is formed to cover the region Rn in which the N-channel MOS transistor is to be formed, followed by the implantation of phosphorus ions ($P^+$) into the region Rn. After that, as shown in FIG. 10(e), a photoresist film FR14 is formed to cover the region Rp in which the P-channel MOS transistor is to be formed, followed by the implantation of boron ions ($B^+$) into the region Rp. As a result, the N-well 11 and P-well 12, in each of which the concentration of the impurity is set to a value for threshold control, are formed in the surface region of the semiconductor substrate 10.

Next, as shown in FIG. 10(f), the silicon dioxide film 13x is removed and the entire surface of the substrate is oxidized to form the silicon dioxide film 15x with a thickness of 10 nm on which is deposited the polysilicon film 16x (first conductive film for gate) with a thickness of 300 nm.

Next, as shown in FIG. 10(g), a photoresist is coated on the top surface of the polysilicon film 16x and the resulting photoresist film and polysilicon film are etched back till the surface of the isolation 17 becomes exposed, thereby planarizing the substrate surface.

Thereafter, the same steps as illustrated in FIGS. 7(f) to 9(e) in the first embodiment are performed, though the description thereof is omitted here.

Compared with the conventional method, the present embodiment can remarkably reduce variations in the length of the gate electrode, similarly to the above second embodiment. Moreover, it is also possible to greatly reduce the area occupied by the source/drain regions. Furthermore, no extra margin is needed for a displacement of masks.

In particular, since the isolation 17 is formed prior to the gate oxidizing step and the step of forming the gate electrode in the present embodiment, unlike the second embodiment, a damage to the gate insulating film accompanying the formation of the isolation 17 can be prevented, while suppressing an adverse influence of thermal experience on device characteristics.

Although the present embodiment has used the silicon nitride film 14x as the etching stopper for forming the trench isolation 17 (FIGS. 10(a) to 10(c)), the etching stopper may be composed of any other film made of a material which functions as the etching stopper and inhibits, when the trench isolation 17 is to be removed, the isolation 17 and the underlying silicon dioxide film 12x from being etched, i.e., a film which presents a higher etching selectivity to the silicon dioxide film. For example, a polysilicon film, an amorphous silicon film, a high-melting-point metal film, a high-melting-point metal compound film, a PSG film, a BPSG film, or the like can be used as the etching stopper.

(Fourth Embodiment)

Below, a description will be given to a fourth embodiment with reference to FIGS. 11(a) to 11(d). FIGS. 11(a) to 11(d) are cross sectional views illustrating a process of manufacturing a semiconductor device according to the present embodiment.

The present embodiment has omitted the drawing of the process of forming the isolation 17, N-well 11, P-well 12, gate electrode 50a, dummy electrodes 50b, gate insulating film 15a, dummy insulating films 15b, gate protective film 19a, dummy protective films 19b, sidewalls 20a and 20b, LDD regions 21a, source/drain regions 21b, and the like, since these components can be formed by either one of the formation processes described in the above second and third embodiments.

At the stage shown in FIG. 11(a), the process shown in FIG. 9(b) of the second embodiment, e.g., has already been completed.

Then, as shown in FIG. 11(b), a titanium nitride film 31y with a thickness of 50 nm is deposited on the substrate as a film for forming the withdrawn electrodes, on which is further deposited a silicon dioxide film 35x with a thickness of 200 nm.

Next, as shown in FIG. 11(c), a photoresist mask FR15 is formed on the silicon dioxide film 35x so as to cover the regions in which the withdrawn electrodes are to be formed. The silicon dioxide film 35x and titanium nitride film 31y are sequentially etched using the photoresist film FR15 as a mask, thereby forming the withdrawn electrodes 31 which are brought into contact with the source/drain regions 21b by self alignment and extend over the dummy electrodes 50b, as shown in FIG. 11(d). On the withdrawn electrodes 31 is left the upper insulating film 35. Thereafter, it is possible to deposit the interlayer insulating film over the substrate, form the connection holes for contact with the withdrawn electrodes, form the buried layers, and form the upper metal interconnections by performing the same process as shown in FIG. 9(e) of the above second embodiment, though the description thereof is omitted here.

Thus, compared with the conventional method, the present embodiment can also remarkably reduce variations in size of the gate electrode, similarly to the above second and third embodiments. Moreover, the area occupied by the source/drain regions can be reduced greatly. Furthermore, no extra margin is needed for a displacement of masks.

In addition, the present embodiment provides the following effects by depositing the silicon dioxide film 35x on the TiN film 31y to form the withdrawn electrodes 31. That is, since the silicon dioxide film 35x which presents excellent surface smoothness because of its amorphous characteristic has been used instead of a tungsten film having a surface prone to the formation of concave and convex portions due to variations in the diameter of a crystal grain, controllability in etching the TiN film 31y (uniformity, pattern dependence) can be improved, which in turn increases the yield of the semiconductor device.

(Fifth Embodiment)

Below, a description will be given to a fifth embodiment with reference to FIGS. 12(a) to 12(e) which illustrate a process of manufacturing a semiconductor device according to the present embodiment.

The present embodiment has also omitted the drawing of the process of forming the isolation 17, N-well 11, P-well 12, gate electrode 50a, dummy electrodes 50b, gate insulating film 15a, dummy insulating films 15b, gate protective film 19a, dummy protective films 19b, sidewalls 20a and 20b, LDD regions 21a, source/drain regions 21b, and the like, since these components can be formed by either one of the formation processes described in the above second and third embodiments.

Figure 12A:
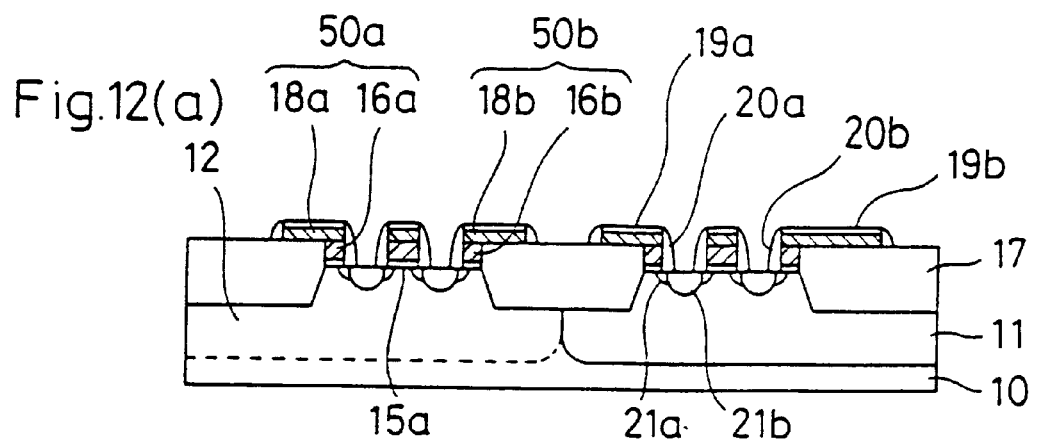
FIGS. 12(a) to 12(e) are cross sectional views illustrating the process of forming withdrawn electrodes in a semiconductor device according to a fifth embodiment.

At the stage shown in FIG. 12(a), the process shown in FIG. 9(b) of the second embodiment, e.g., has already been completed. In the present embodiment, an underlying buried conductive film for contact with the source/drain regions 21b is formed by a blanket-tungsten CVD.

Figure 12B:
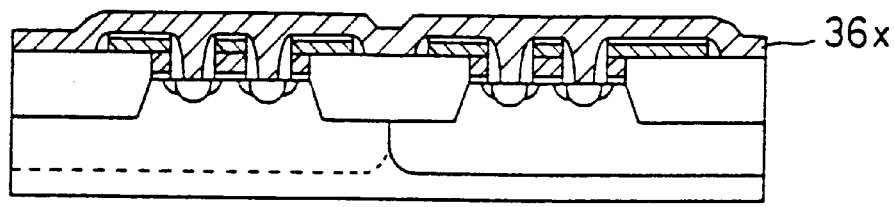
Figure 12C:
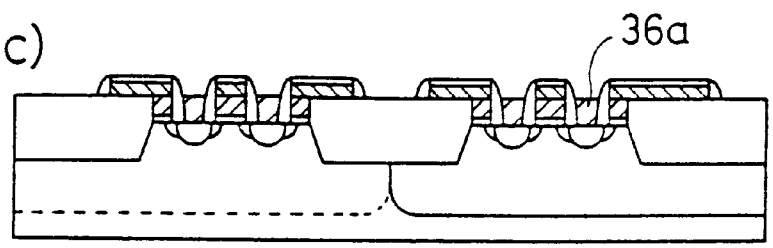

Specifically, as shown in FIG. 12(b), the underlying metal film 36x consisting of W/TiN films is deposited on the substrate, which is then etched back. Consequently, as shown in FIG. 12(c), buried conductive films 36a are left only in portions located above the source/drain regions 21b, which have formed concave portions between the gate electrode 50a and the dummy electrodes 50b.

Figure 12D:
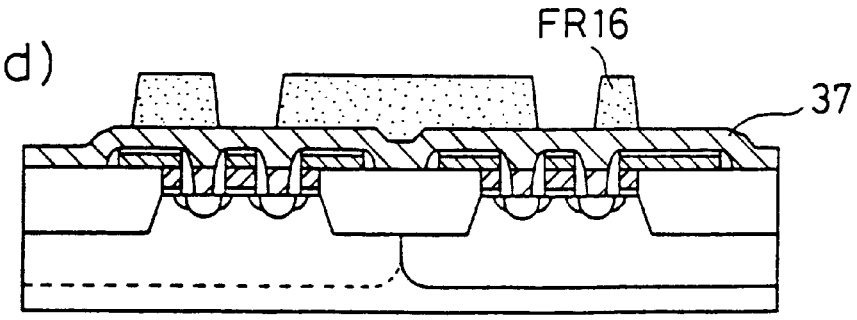
Figure 12E:
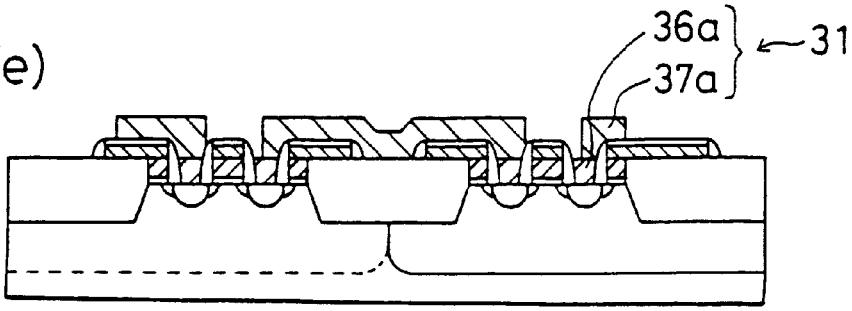
Figure 14:
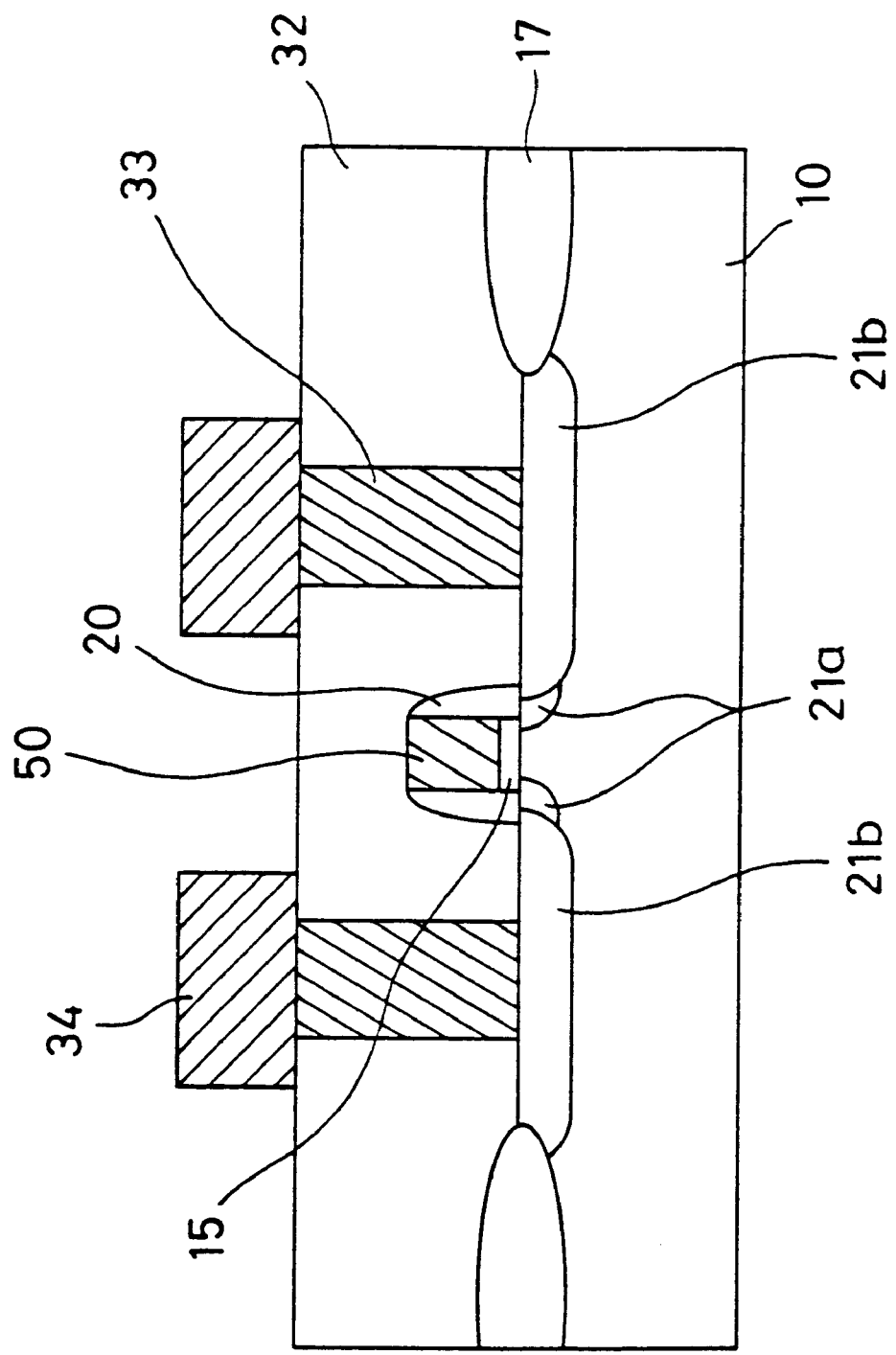
FIG. 14 is a cross sectional view of a conventional semiconductor device.
Figure 15:
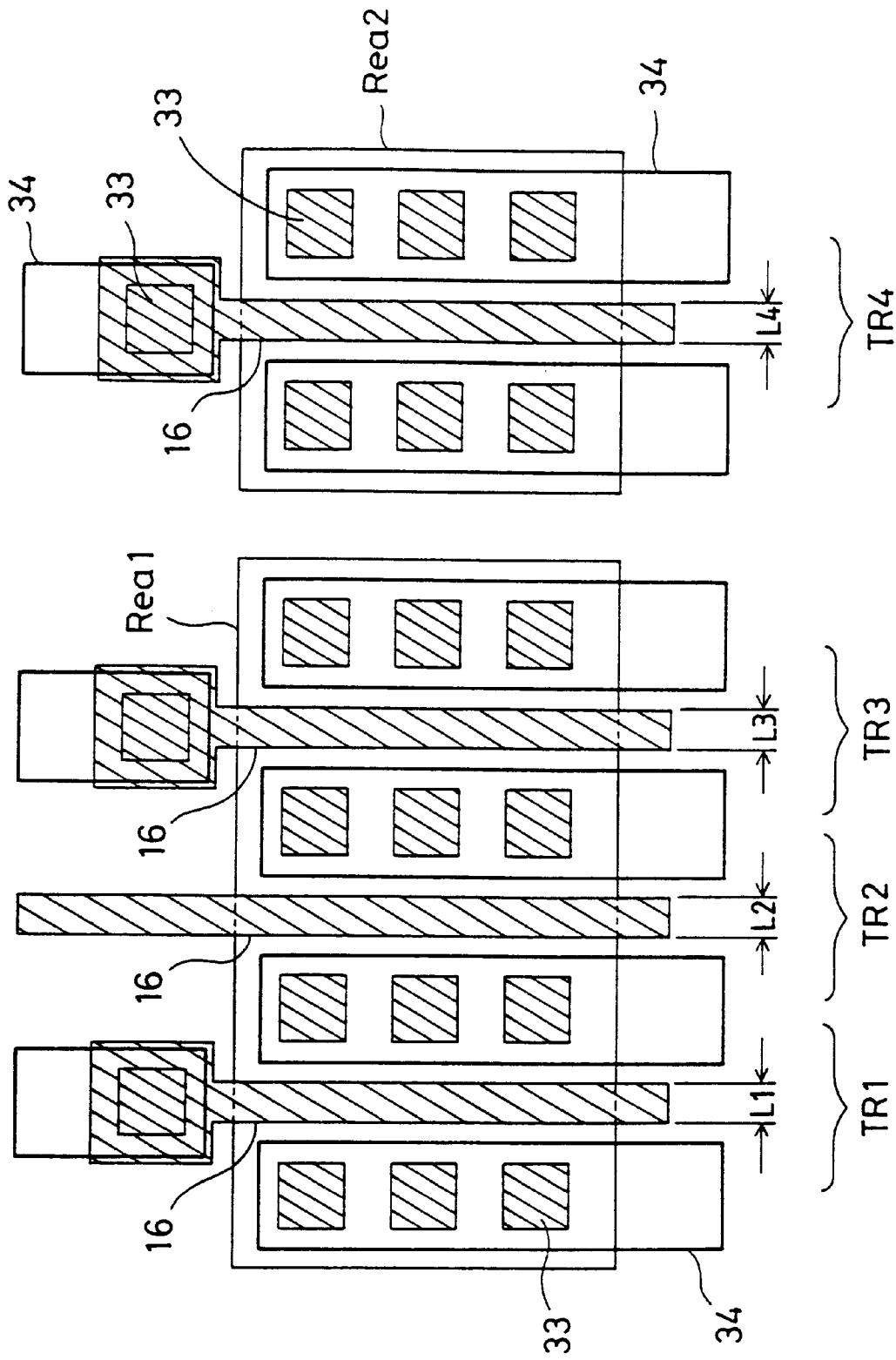
FIG. 15 is a plan view showing the layout of the conventional semiconductor device.

Next, as shown in FIG. 12(d), an overlying metal film 37x consisting of W/TiN films is deposited again over the substrate, on which is formed a photoresist film FR16 which covers the regions in which the withdrawing electrodes are to be formed. The overlying metal film 37x is etched using the photoresist FR16 as a mask, thereby forming the withdrawn electrodes 31 which are brought into contact with the source/drain regions 21b by self alignment and which consist of the buried conductive films 36 and upper films 37a.

Compared with the conventional method, the present embodiment can also remarkably reduce variations in the length of the gate electrode 50a, similarly to the above second to fourth embodiments. Moreover, the area occupied by the source/drain regions 21b can be reduced greatly. Furthermore, no extra margin is needed for a displacement of masks.

In addition, since the present embodiment has formed the conductive film for forming the withdrawn electrodes 31 at two separate stages, the underlying metal film 36x and the overlying metal film 37x can be made of different materials through arbitrary setting. For example, by composing the underlying metal film 36x of a material which can reduce a contact resistance between the source/drain regions 21b and the underlying metal film 36x, the overall semiconductor device can be operated at a lower voltage. On the other hand, by composing the overlying metal film 37x of a material which allows the overlying metal film 37x to function as the etching stopper in etching, the ease of processing of the overlying metal film 37x can be improved.

In the present embodiment, the underlying metal film 36x can also be composed of a tungsten film or an aluminum film formed by selective CVD, a silicon film formed by selective epitaxial growth, or a titanium silicide film or a cobalt silicide film formed through silicidization. With the underlying metal film 36x composed of any one of these films, the thickness of the polysilicon film 16x composing the gate electrode 50a or the like can be reduced, resulting in a reduced difference in level in terms of the whole substrate. Accordingly, the processing of the overlying metal film 37x and upper metal interconnections is further facilitated. Moreover, even when the spacings between the electrodes are not set to the specified value So by use of the dummy electrodes 50b, the withdrawn electrodes 31 can be brought into contact with the source/drain regions 21b by self alignment, so that the degree of freedom for layout can be enhanced.

The etching selectivity of the overlying metal film 37x to the underlying metal film 36x is preferably 4 or more and remarkable effects can be obtained when it is 10 or more.

(Six Embodiment)

Below, a description will be given to a six embodiment. FIGS. 13(a) to 13(e) are cross sectional views illustrating a process of manufacturing a semiconductor device according to the present embodiment.

The present embodiment has also omitted the drawing of the process of forming the isolation 17, N-well 11, P-well 12, gate electrode 50a, dummy electrodes 50b, gate insulating film 15a, dummy insulating films 15b, gate protective film 19a, dummy protective films 19b, sidewalls 20a and 20b, LDD regions 21a, source/drain regions 21b, and the like, since these components can be formed by either one of the formation processes described in the above second and third embodiments.

At the stage shown in FIG. 13(a), the process shown in FIG. 9(b) of the second embodiment, e.g., has already been completed.

Then, as shown in FIG. 13(b), an underlying metal film consisting of W/Ti films is deposited on the substrate. After that, a photoresist is coated on the substrate and then etched back, thereby leaving a photoresist film FR17 only in portions immediately above the source/drain regions 21b. Subsequently, the underlying metal film 36y is etched using the photoresist film FR17 as a mask, thereby forming lower films 36b for contact with the source/drain regions 21b, as shown in FIG. 13(c).

Next, as shown in FIG. 13(d), an overlying metal film 37Y consisting of W/TiN films is deposited over the substrate on which is formed a photoresist film FR18 for covering the regions in which the withdrawn electrodes are to be formed. The overlying metal film 37y is then etched using the photoresist film FR18, thereby forming the withdrawn electrodes 31 consisting of upper films 37b and the lower films 36b, as shown in FIG. 13(e).

Compared with the conventional method, the present embodiment can also remarkably reduce variations in the length of the gate electrode 50a, similarly to the above second to fifth embodiments. Moreover, the area occupied by the source/drain regions 21b can be reduced greatly. Furthermore, no extra margin is needed for a displacement of masks.

Moreover, since the present embodiment has formed the conductive film for forming the withdrawn electrodes at two separate stages, similarly to the above fifth embodiment, the underlying metal film 36y and the overlying metal film 37y can be made of different materials through arbitrary setting. In the present embodiment, the W/Ti films used as the underlying metal film 36y function not only as a barrier metal between the source/drain regions 21b and the metal interconnections but also as an etching stopper in etching the titanium nitride films used as the overlying metal film 37y. As a result, the ease of processing of the overlying metal film 37y can be improved.

(Other Embodiments)

Although the second to sixth embodiments have used the method wherein the photoresist is coated and then etched so as to form the isolation, such methods as CMP (Chemical Mechanical Polishing), SOG (Spin On Glass Coating), and BPSG flow may also be used instead.

Although the above second to sixth embodiments have composed each of the gate electrode 50a and dummy electrodes 50b of the two-layer film consisting of the tungsten film and the polysilicon film, the upper layer of each of the electrodes may also be composed of any one of a metal film other than the tungsten film, a metal compound film such as silicide, a polysilicon film, and an amorphous silicon film or of a multilayer film thereof.

Although the silicon dioxide films deposited by CVD have been used as the gate protective film, dummy protective films, and sidewalls, films composed of another insulating material such as a silicon nitride film may be used instead.

The above withdrawn electrodes 31 may also be composed of a titanium tungsten film, a titanium silicide film, a tungsten silicide film, or the like.

Although each of the above embodiments has provided the MOS transistor with the LDD regions and the source/drain regions containing an impurity at a high concentration, the present invention is also applicable to a semiconductor device on which a MOS transistor of so-called DD structure having only one type of source/drain regions or a MOS transistor provided with a punch-through stopper is mounted.

We claim:

1. A method of manufacturing a semiconductor device comprising at least the steps of:

forming an isolation which surrounds an active region on a semiconductor substrate;

forming at least one gate electrode on said active region, while simultaneously forming a pair of dummy electrodes which extend over said active region and said isolation and substantially in parallel with said-gate electrode; and forming source/drain regions by introducing an impurity into portions of the semiconductor substrate which are located on both sides of said gate electrode.

2. A method of manufacturing a semiconductor device according to claim 1, further comprising the steps of:

forming electrode sidewalls and dummy sidewalls on side faces of said gate electrode and on side faces of said dummy electrodes, respectively, each of said electrode sidewalls and dummy sidewalls being made of an insulating material; and forming withdrawn electrodes which are brought into contact with said source/drain regions by self alignment.

3. A method of manufacturing a semiconductor device comprising the steps of:

forming a gate insulting film and a first conductive film for gate successively on a semiconductor substrate;

selectively etching said first conductive film for gate, said gate insulating film, and said semiconductor substrate in a region in which an isolation is to be formed so as to form a trench;

after forming an insulating film for isolation on the substrate formed with said trench, removing said insulating film for isolation till a surface of said first conductive film for gate becomes exposed and a surface of the substrate is planarized so as to form the isolation from a part of said insulating film for isolation left in said trench;

forming at least a second conductive film for gate on said planarized substrate and selectively etching said first and second conductive films for gate and said gate insulating film so as to form a gate electrode from said first and second conductive films for gate left on said active region;

introducing an impurity into portions of the semiconductor substrate which are located on both sides of said gate electrode so as to form source/drain regions;

forming electrode sidewalls and isolation sidewalls on side faces of said gate electrode and on side faces of said isolation, respectively, each of said electrode sidewalls and isolation sidewalls being made of an insulating material; and forming withdrawn electrodes which are brought into contact with said source/drain regions by self alignment.

4. A method of manufacturing a semiconductor device comprising the steps of:

forming an oxide film and an etching stopper film successively on a semiconductor substrate;

selectively etching said etching stopper film, said oxide film, and said semiconductor substrate in a region in which an isolation is to be formed so as to form a trench;

after forming an insulating film for isolation on the substrate formed with said isolation, removing said insulating film for isolation till a surface of said etching stopper film becomes exposed and a surface of the substrate is planarized so as to form the isolation from said insulating film for isolation left in said trench;

after removing said oxide film and said etching stopper film, forming a gate insulating film and a first conductive film for gate successively on the substrate;

removing said first conductive film for gate and said gate insulating film till at least a surface of said isolation becomes exposed and the surface of the substrate is planarized;

forming at least a second conductive film for gate on said planarized substrate and selectively etching said first and second conductive films for gate and said gate insulating film so as to form a gate electrode from said first and second conductive films for gate left on said active region;

introducing an impurity into portions of the semiconductor substrate which are located on both sides of said gate electrode so as to form source/drain regions;

forming electrode sidewalls and isolation sidewalls on side faces of said gate electrode and on side faces of said isolation, respectively, each of said electrode sidewalls and isolation sidewalls being made of an insulating material; and forming withdrawn electrodes which are brought into contact with said source/drain regions by self alignment.

5. A method of manufacturing a semiconductor device according to claim 1, wherein said step of forming said gate electrode and said dummy electrodes is performed such that one gate electrode is formed on said active region and that said gate electrode and said dummy electrodes are arranged at substantially regular intervals.

6. A method of manufacturing a semiconductor device according to claim 1, wherein said step of forming said gate electrode and said dummy electrodes is performed such that a plurality of gate electrodes are formed on said active region and that said gate electrodes and said dummy electrodes are arranged at substantially regular intervals.

7. A method of manufacturing a semiconductor device according to claim 4, wherein said etching stopper film is composed of at least any one of a silicon nitride film, a polysilicon film, an amorphous silicon film, a metal film, a metal compound film, a PSG film, and a BPSG film.

8. A method of manufacturing a semiconductor device according to claim 3, wherein said second conductive film for gate is composed of at least any one of a metal film, a metal compound film, a polysilicon film, and an amorphous silicon film.

9. A method of manufacturing a semiconductor device according to claim 4, wherein said second conductive film for gate is composed of at least any one of a metal film, a metal compound film, a polysilicon film, and an amorphous silicon film.

10. A method of manufacturing a semiconductor device according to claim 2, wherein said step of forming said withdrawn electrodes consists of the steps of:

forming respective lower films, each composed of a first conductive film, which are brought into contact with said source/drain regions; and forming, on said lower films, respective upper films each composed of a second conductive film which has an etching selectivity higher than that of said first conductive film.

11. A method of manufacturing a semiconductor device according to claim 10, wherein in said step of forming the lower films of said withdrawn electrodes, the first conductive film is formed on the substrate and then etched back so as to leave said first conductive film only in portions immediately above said source/drain regions.

12. A method of manufacturing a semiconductor device according to claim 10, wherein in said step of forming the lower films of said withdrawn electrodes, the first conductive film is formed on the substrate, a member for masking is formed on said first conductive film, the entire surface of said member for masking is etched back to be left only in portions above said source/drain regions, and then said first conductive film is etched by using the remaining member for masking.

13. A method of manufacturing a semiconductor device according to claim 2, wherein said step of forming said withdrawn electrodes consists of the steps of:
   forming a conductive film for withdrawn electrodes on the substrate;
   forming an amorphous film on said conductive film for withdrawn electrodes; and
   sequentially etching said amorphous film and said conductive film for withdrawn electrodes by using a common mask which covers respective regions in which the withdrawn electrodes are to be formed.

* * * * *